United States Patent
Tanaka et al.

(10) Patent No.: US 11,862,687 B2
(45) Date of Patent: Jan. 2, 2024

(54) NITRIDE SEMICONDUCTOR DEVICE AND METHOD FOR FABRICATING NITRIDE SEMICONDUCTOR DEVICE

(71) Applicant: FUJI ELECTRIC CO., LTD., Kanagawa (JP)

(72) Inventors: Ryo Tanaka, Hino (JP); Shinya Takashima, Hachioji (JP); Hideaki Matsuyama, Hino (JP); Katsunori Ueno, Matsumoto (JP); Masaharu Edo, Tokorozawa (JP)

(73) Assignee: FUJI ELECTRIC CO., LTD., Kanagawa (JP)

( * ) Notice: Subject to any disclaimer, the term of this patent is extended or adjusted under 35 U.S.C. 154(b) by 92 days.

(21) Appl. No.: 17/001,617

(22) Filed: Aug. 24, 2020

(65) Prior Publication Data

US 2021/0104607 A1  Apr. 8, 2021

(30) Foreign Application Priority Data

Oct. 3, 2019  (JP) .................................. 2019-183283

(51) Int. Cl.
*H01L 29/20* (2006.01)
*H01L 21/20* (2006.01)
(Continued)

(52) U.S. Cl.
CPC .......... *H01L 29/2003* (2013.01); *H01L 21/20* (2013.01); *H01L 21/265* (2013.01);
(Continued)

(58) Field of Classification Search
CPC ... H01L 29/2003; H01L 21/265; H01L 29/16; H01L 29/1066; H01L 29/66893;
(Continued)

(56) References Cited

U.S. PATENT DOCUMENTS

2014/0210008 A1  7/2014  Oritsuki
2015/0041886 A1  2/2015  Pala
(Continued)

FOREIGN PATENT DOCUMENTS

JP  2008103636 A  5/2008
JP  2014039057 A  2/2014
(Continued)

OTHER PUBLICATIONS

Office Action issued for counterpart Japanese Application No. 2019-183283, transmitted from the Japanese Patent Office dated Sep. 26, 2023 (drafted on Sep. 21, 2023).

*Primary Examiner* — Nelson Garces
*Assistant Examiner* — Quinton A Brasfield

(57) ABSTRACT

A nitride semiconductor device is provided, comprising: a first nitride semiconductor layer of a first conductivity-type; a second nitride semiconductor layer of a second conductivity-type provided above the first nitride semiconductor layer; a junction region of a first conductivity-type which is provided to extend in a direction from a front surface of the second nitride semiconductor layer to the first nitride semiconductor layer and has a doping concentration $N_{JFET}$ equal to or higher than that of the first nitride semiconductor layer; and a source region of a first conductivity-type which is provided more shallowly than the junction region and has a doping concentration equal to or higher than the doping concentration $N_{JFET}$, wherein a dopant of the source region is an element with an atomic weight larger than that of a dopant in the junction region.

21 Claims, 15 Drawing Sheets

(51) Int. Cl.
  *H01L 21/265* (2006.01)
  *H01L 29/78* (2006.01)
  *H01L 29/66* (2006.01)
  *H01L 29/06* (2006.01)
  *H01L 29/16* (2006.01)

(52) U.S. Cl.
  CPC .......... *H01L 29/0684* (2013.01); *H01L 29/16* (2013.01); *H01L 29/66734* (2013.01); *H01L 29/7802* (2013.01)

(58) Field of Classification Search
  CPC ............. H01L 29/1058; H01L 29/8086; H01L 2924/13062; H01L 27/098
  See application file for complete search history.

(56) References Cited

U.S. PATENT DOCUMENTS

| | | | |
|---|---|---|---|
| 2015/0084063 A1* | 3/2015 | Van Brunt | H01L 29/872 257/77 |
| 2015/0097226 A1* | 4/2015 | Lichtenwalner | H01L 29/1095 257/329 |
| 2017/0092758 A1* | 3/2017 | Ueno | H01L 29/7813 |
| 2019/0109224 A1* | 4/2019 | Tomita | H01L 29/66727 |
| 2020/0052104 A1* | 2/2020 | Tomita | H01L 29/086 |

FOREIGN PATENT DOCUMENTS

| | | |
|---|---|---|
| JP | 2014146738 A | 8/2014 |
| JP | 6032337 B1 | 11/2016 |
| JP | 6183310 B2 | 8/2017 |
| JP | 6306704 B2 | 4/2018 |
| JP | 2018181892 A | 11/2018 |
| WO | 2014083771 A1 | 6/2014 |

* cited by examiner

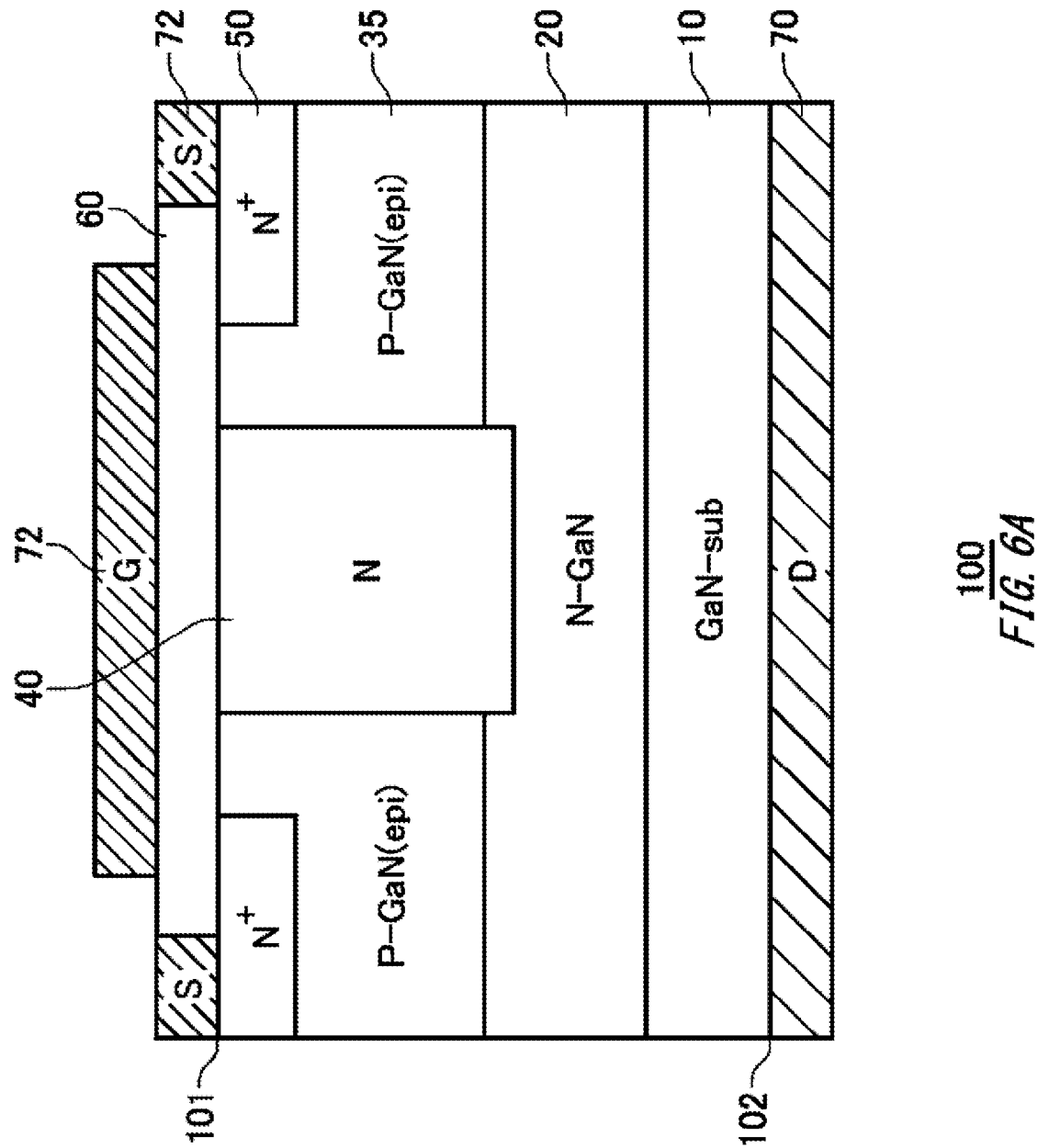

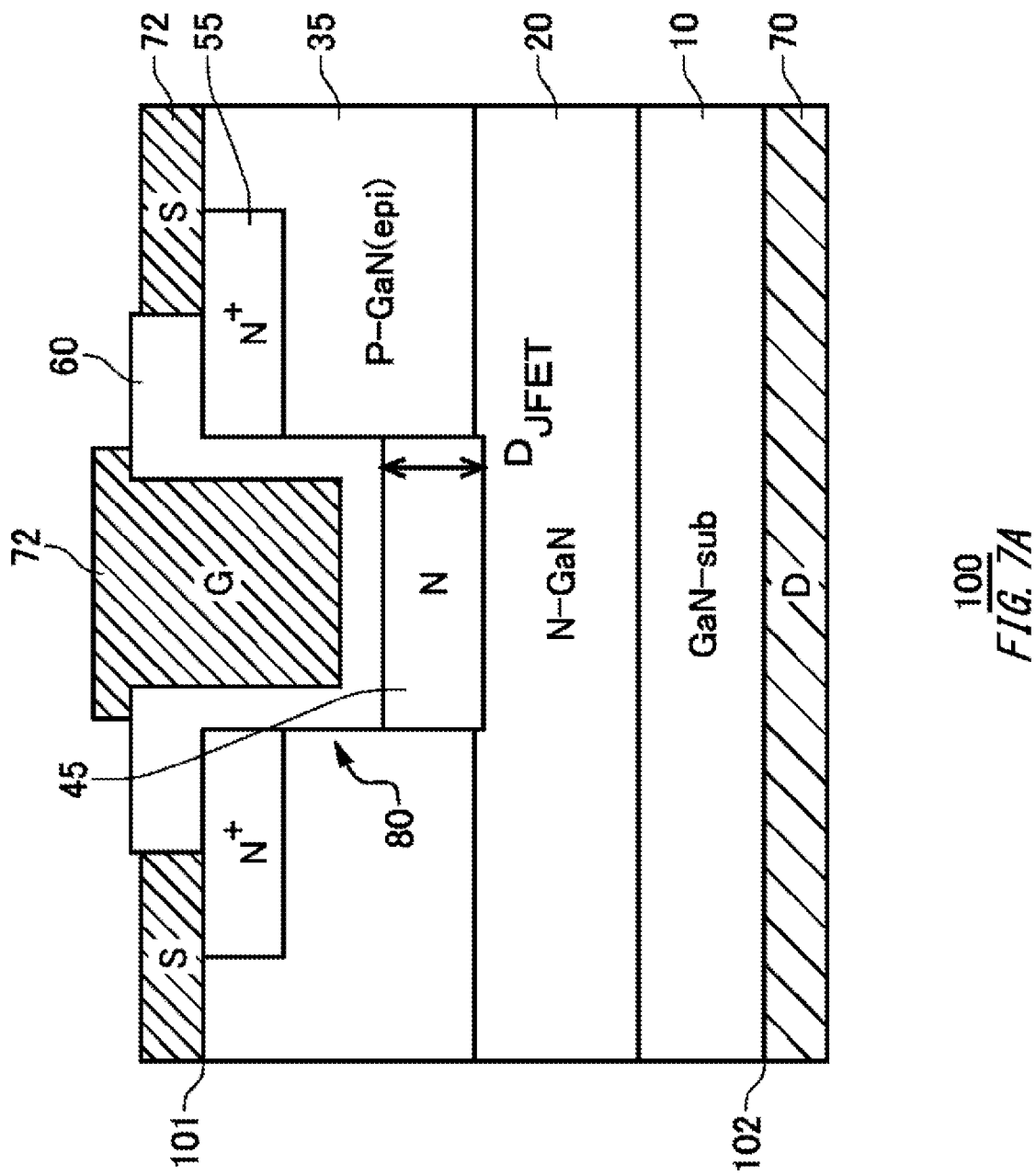

NITRIDE SEMICONDUCTOR DEVICE AND METHOD FOR FABRICATING NITRIDE SEMICONDUCTOR DEVICE

BACKGROUND

1. Technical Field

The present invention relates to a nitride semiconductor device and a method for fabricating the nitride semiconductor device.

2. Related Art

Conventionally, a nitride semiconductor device having an N-type region formed by ion-implanting N-type dopants is known (For example, see Patent document 1-3).

[Patent document 1] Japanese Patent No. 6183310 specification

[Patent document 2] Japanese Patent No. 6032337 specification

[Patent document 3] Japanese Patent No. 6306704 specification

In a case of GaN material, forming an N-type region by deeply doping silicon (Si), as in counter doping, requires ultra-high energy which is 1 MeV or more, and increases a facility cost for the fabrication. On the other hand, when a source contact region is shallowly formed with a high doping concentration, there is a problem that an element with a low atomic weight causes a deep tail.

In a first aspect of the present invention, a nitride semiconductor device is provided, including: a first nitride semiconductor layer of a first conductivity-type; a second nitride semiconductor layer of a second conductivity-type provided above the first nitride semiconductor layer; a junction region of a first conductivity-type which is provided to extend in a direction from a front surface of the second nitride semiconductor layer to the first nitride semiconductor layer and has a doping concentration $N_{JFET}$ equal to or higher than that of the first nitride semiconductor layer; and a source region of a first conductivity-type which is provided more shallowly than the junction region and has a doping concentration equal to or higher than the doping concentration $N_{JFET}$, wherein a dopant of the source region is an element with an atomic weight larger than that of a dopant in the junction region.

The first conductivity-type is N-type, a dopant of the junction region is oxygen (O), and a dopant of the source region may include any one of silicon (Si) and germanium (Ge).

The width $W_{JFET}$ of the junction region may meet the following condition: $0.5\ \mu m \leq W_{JFET} \leq 3\ \mu m$.

The doping concentration $N_{JFET}$ may meet a following condition in which a width $W_{JFET}$ (μm) of the junction region is used: $2\times10^{17}\times\exp(-1.15\times W_{JFET})\ cm^{-3} \leq N_{JFET} \leq 2\times10^{18}\times\exp(-0.75\times W_{JFET})\ cm^{-3}$.

A dose $Dose_{JFET}$ in the junction region may meet a following condition in which a width $W_{JFET}$ (μm) of the junction region is used: $1.3\times10^{13}\times\exp(-1.15\times W_{JFET})\ cm^{-2} \leq Dose_{JFET} \leq 1.3\times10^{14}\times\exp(-0.75\times W_{JFET})\ cm^{-2}$.

In a second aspect of the present invention, a nitride semiconductor device is provided, the device including: a first nitride semiconductor layer of a first conductivity-type; a second nitride semiconductor layer of a second conductivity-type provided above the first nitride semiconductor layer; a junction region of a first conductivity-type which is provided to extend from a front surface of the second nitride semiconductor layer to the first nitride semiconductor layer and has a doping concentration $N_{JFET}$ equal to or higher than that of the first nitride semiconductor layer; a source region of a first conductivity-type which is provided more shallowly than the junction region and has a doping concentration equal to or higher than the doping concentration $N_{JFET}$, wherein the doping concentration $N_{JFET}$ meets a following condition in which a dopant concentration NF in the second nitride semiconductor layer is used: $N_{Epi}+5\times10^{15}\ cm^{-3} \leq N_{JFET} \leq N_{Epi}+2\times10^{18}\ cm^{-3}$.

The nitride semiconductor device may have a trench portion in the second nitride semiconductor layer and include a junction region at the bottom of the trench portion.

The junction region may include a plurality of dopants ion-implanted with various depths.

The depth $D_{JFET}$ of the junction region may meet the following condition in which the depth $D_{2\text{-}NSL}$ of the second nitride semiconductor layer is used: $D_{JFET} \geq D_{2\text{-}NSL}$.

The depth $D_{JFET}$ of the junction region may be 300 nm or more.

The depth $D_{JFET}$ of the junction region may meet the following condition: $500\ nm \leq D_{JFET} \leq 1.5\ \mu m$.

The depth $D_{2\text{-}NSL}$ of the second nitride semiconductor layer may meet the following condition: $200\ nm \leq D_{2\text{-}NSL} \leq 2\ \mu m$.

The depth $D_{2\text{-}NSL}$ of the second nitride semiconductor layer may meet the following condition: $500\ nm \leq D_{2\text{-}NSL} \leq 1.5\ \mu m$.

The dose $Dose_S$ in the source region may meet the following condition: $5\times10^{14}\ cm^{-2} \leq Dose_S \leq 1\times10^{16}\ cm^{-2}$.

The tail length from a peak of a doping concentration in the junction region to a lower end injunction region may be less than a tail length from a peak of a doping concentration in the source region to a lower end in the source region.

The tail length from a peak of a doping concentration in the junction region to a lower end injunction region may be within a range of ±10% of a tail length from a peak of a doping concentration in the source region to a lower end in the source region.

In a third aspect of the present invention, a method for fabricating a nitride semiconductor device is provided, the method including: providing a junction region by ion-implanting dopant ions of a first conductivity-type; and providing a source region which is shallower than the junction region by ion-implanting an ion of an element with an atomic weight higher than that of a dopant of the junction region, wherein a doping concentration $N_{JFET}$ in the junction region meets the following condition: $5\times10^{15}\ cm^{-3} \leq N_{JFET} \leq 2\times10^{18}\ cm^{-3}$.

The method for fabricating a nitride semiconductor device may include providing a trench portion through etching before ion-implantation on the junction region.

The method for fabricating for a nitride semiconductor device may include annealing at a first temperature after ion-implantation on the junction region; and annealing at a second temperature different from the first temperature after ion-implantation on the source region.

The first temperature may be 1300° C. or more.

The summary clause does not necessarily describe all necessary features of the embodiments of the present invention. The present invention may also be a sub-combination of the features described above.

BRIEF DESCRIPTION OF THE DRAWINGS

FIG. 6A shows one example of a configuration of the nitride semiconductor device 100 according to example 2.

FIG. 7A shows one example of the configuration of the nitride semiconductor device 100 according to example 3.

DESCRIPTION OF EXEMPLARY EMBODIMENTS

Hereinbelow, the present invention will be described through embodiments of the invention, but the following embodiments do not limit the invention disclosed in claims. In addition, not all combinations of features described in the embodiments necessarily have to be essential to solving means of the invention.

In this specification, one side in a direction parallel to a depth direction of a semiconductor substrate is referred to as "upper", and the other side is referred to as "lower". One surface of the two main surfaces of a substrate, layer, or other members is referred to as a front surface, and the other surface is referred to as a back surface. The "upper", "lower", "front", and "back" directions are not limited to the gravitational direction or the direction of attachment to a substrate or the like at the time of mounting of a semiconductor device.

In this specification, "N" or "P" attached on a layer or region means that the main dopant therein is electron and hole, respectively. The sign "+" or "−" given to the character "N" or "P" means having a higher or lower doping concentration than layers or regions without it, respectively.

Figure 1A:
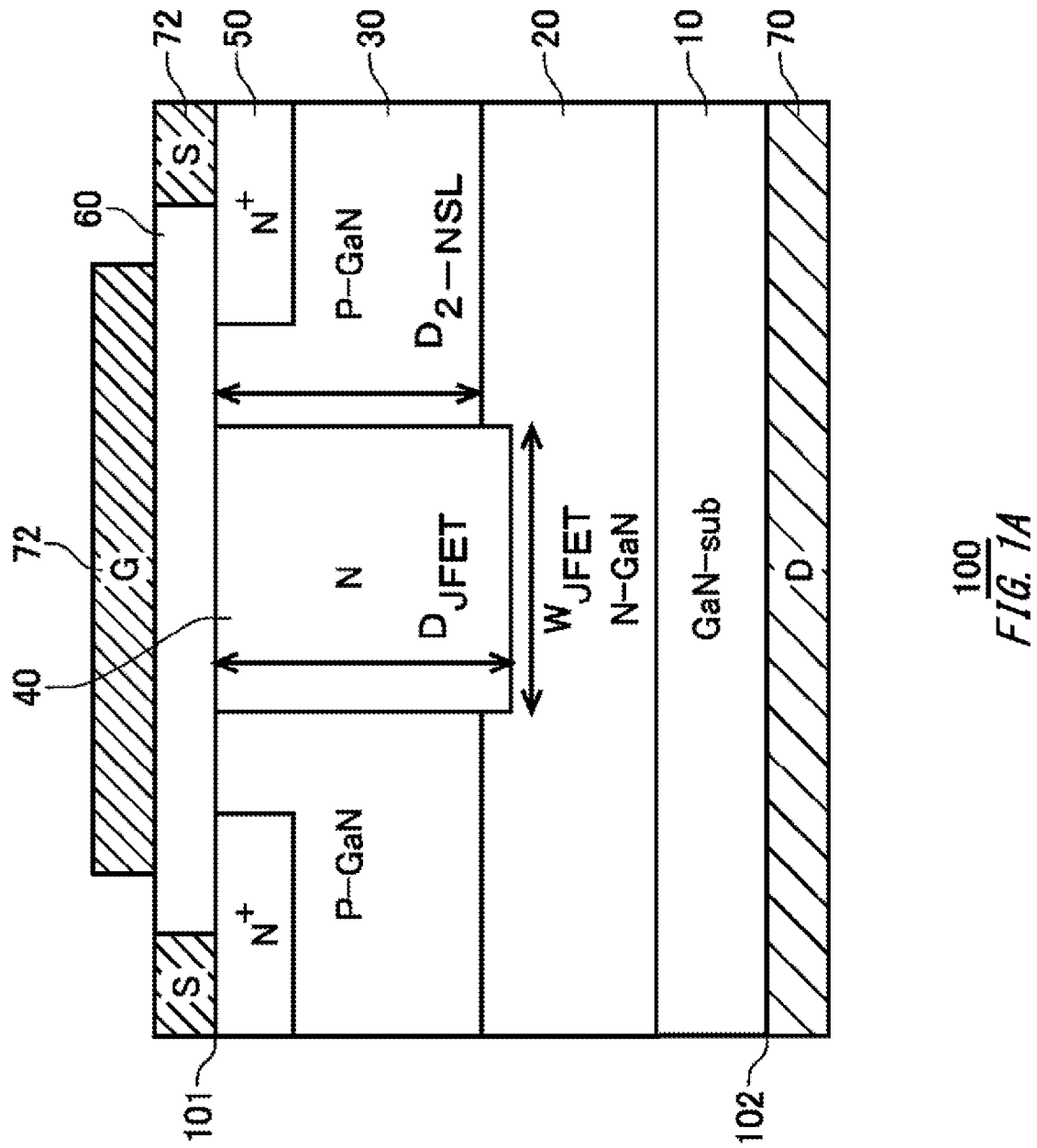
FIG. 1A shows one example of a nitride semiconductor device 100 according to example 1.

FIG. 1A shows one example of the configuration of a nitride semiconductor device 100 according to example 1.

The nitride semiconductor device 100 is one example of the MOSFET structure, and is not limited to the present embodiment.

The nitride semiconductor device 100 of the present example includes a first nitride semiconductor layer 10, an epitaxial layer 20, a second nitride semiconductor layer 30, a junction region 40, a source region 50, an insulating layer 60, an electrode 70, and an electrode 72. A front surface 101 indicates the upper surface of the nitride semiconductor layer included in the nitride semiconductor device 100. A back surface 102 indicates the lower surface of the nitride semiconductor layer included in the nitride semiconductor device 100. In the present example, the front surface 101 corresponds to the upper surface of the second nitride semiconductor layer 30, and the back surface 102 corresponds to the lower surface of the first nitride semiconductor layer 10.

In one example, the first nitride semiconductor layer 10 is an N-type free-standing substrate GaN substrate. The first nitride semiconductor layer 10 may be provided by using any method such as a vapor deposition method including an HVPE, or a liquid deposition method. The first nitride semiconductor layer 10 may be cut out of a GaN layer which is epitaxially deposited.

The epitaxial layer 20 is a layer epitaxially deposited on the first nitride semiconductor layer 10. In one example, the epitaxial layer 20 is an N-type GaN layer. The thickness of the epitaxial layer 20 is not particularly limited.

The second nitride semiconductor layer 30 is provided on the epitaxial layer 20. The second nitride semiconductor layer 30 may be provided by ion-implanting P-type dopants into a layer of the same material as the epitaxial layer 20 being N-type. For example, the P-type dopant of the second nitride semiconductor layer 30 is magnesium (Mg). In one example, the film thickness $D_{2\text{-}NSL}$ of the second nitride semiconductor layer 30 is 300 nm or more. More preferably, the film thickness meets the following condition: 500 nm ≤ $D_{2\text{-}NSL}$ ≤ 1.5 μm.

The junction region 40 is provided above the epitaxial layer 20. The junction region 40 of the present example is provided to extend through the second nitride semiconductor layer 30 into the epitaxial layer 20. The junction region 40 is formed by ion-implanting N-type dopants from the side of the front surface 101 of the second nitride semiconductor layer 30.

In one example, the dopant of the junction region 40 includes at least one of oxygen (O) and silicon (Si). For example, the depth $D_{JFET}$ of the junction region 40 meets the following condition: $D_{JFET} \geq D_{2\text{-}NSL}$. Also, the depth $D_{JFET}$ of the junction region 40 may meet the following condition: 200 nm ≤ $D_{JFET}$ ≤ 2 μm. More preferably, the depth may meet the following condition: 500 nm ≤ $D_{JFET}$ ≤ 1.5 μm.

The source region 50 is provided on the side of the front surface 101 of the second nitride semiconductor layer 30. The source region 50 is provided more shallowly than the junction region 40. In one example, the depth of the source region 50 is 10 nm or more and 100 nm or less.

The source region 50 of the present example is provided by ion-implanting N-type dopants into the second nitride semiconductor layer 30. The doping concentration of the source region 50 may be higher than that of the junction region 40. For example, the dopant of the source region 50 includes at least one of silicon (Si) and germanium (Ge). In one example, the dose $Dose_S$ of the source region 50 meets the following condition: $5 \times 10^{14}$ cm$^{-2}$ ≤ $Dose_S$ ≤ $1 \times 10^{16}$ cm$^{-2}$.

The dopant of the source region 50 is an element with an atomic weight higher than that of the dopant of the junction region 40. For example, the dopant of the junction region 40 is oxygen (O), and the dopant of the source region 50 includes any one of silicon (Si) and germanium (Ge). Also, the dopant of the junction region 40 may be silicon (Si), and the dopant of the source region 50 may be germanium (Ge).

The insulating layer 60 is provided on the front surface 101 of the second nitride semiconductor layer 30. In addition, the insulating layer 60 is also provided above the junction region 40 and the source region 50. The insulating layer 60 may have an opening to electrically connect an electrode 72 with the source region 50. The insulating layer 60 prevents the electrode 72 provided above the second nitride semiconductor layer 30 from being electrically shorted with the second nitride semiconductor layer 30 and the junction region 40. For example, the insulating layer 60 is the oxide film of silicon dioxide ($SiO_2$) and the like. The insulating layer 60 may be a nitride film of silicon nitride (SiN) and the like.

The electrode 70 is provided on the back surface 102 of the first nitride semiconductor layer 10. The electrode 70 of the present example serves as a drain electrode (D).

The electrode 72 is provided above the front surface 101. The electrode 72 of the present example has a gate electrode (G) provided above the junction region 40 and the insulating layer 60. The electrode 72 may have a source electrode (S) provided on the source region 50. For example, the electrode 72 is a nickel (Ni)/gold (Au) electrode.

In the nitride semiconductor device 100 of the present example, a dopant with an atomic weight lower than that of the dopant of the source region 50 is ion-implanted into the shallow junction region 40, and a dopant with an atomic weight higher than that of the dopant of the junction region 40 is ion-implanted into the deep source region 50. The nitride semiconductor device 100 in which a damage due to ion-implantation is reduced can be provided by selecting a dopant with an appropriate atomic weight depending on the depth of the N-type region. Also, an ultra-high energy ion implantation apparatus can be unnecessary for the fabrication of the nitride semiconductor device 100.

It is noted that the junction region 40 may include a plurality of dopants which is ion-implanted with various depths. Also, in the junction region 40, an element with a high atomic weight may be ion-implanted into a shallow region, and an element with a low atomic weight may be ion-implanted into a deep region. For example, in the junction region 40, oxygen (O) and silicon (Si) is ion-implanted as a dopant. Moreover, the junction region 40 may have a region in which silicon (Si) is doped and a region in which oxygen (O) is doped deeper than silicon (Si). Thereby, the hysteresis of the nitride semiconductor device 100 is improved.

In the junction region 40, a dopant with an atomic weight similar to that of the Ga element may be ion-implanted into the a shallow region, and dopant with an atomic weight far from that of the Ga element may be ion-implanted into a deep region. In other words, ion-implantation of a dopant with an atomic weight similar to Ga element into a region near the insulating layer 60 serving as a gate oxide film reduces a distortion which degrades the electrical characteristics around a gate structure, resulting in the improvement of characteristics of the nitride semiconductor device 100.

The epitaxial layer 20 in the nitride semiconductor device 100 of the present example may be an n-type GaN layer with a low concentration formed on an n-type substrate with a high concentration. In this case, the n-type GaN layer with a low concentration may be provided by using a vapor deposition method such as HVPE and MOCVD, a liquid deposition method, an ion-implantation, and any other method.

The nitride semiconductor device 100 of the present example includes epitaxial layer 20, but it may not include the epitaxial layer 20 in another example. In this case, the nitride semiconductor device 100 includes the first nitride semiconductor layer 10, the second nitride semiconductor layer 30, the junction region 40, the source region 50, the insulating layer 60, the electrode 70, and the electrode 72.

The second nitride semiconductor layer 30 is provided on the first nitride semiconductor layer 10. Also, the junction region 40 is provided to extend through the second nitride semiconductor layer 30 into the first nitride semiconductor layer 10. Other features are similar to those in example 1.

For the nitride semiconductor device 100, a type of the N-type dopant may be selected according to the depth of the N-type region and the application. For example, for the deep junction region 40 such as the counter doping into JFET, an element with a low atomic weight such as oxygen (O) and silicon (Si) is selected. For the shallow source region 50 such as a source contact portion, an element with a high atomic weight such as silicon (Si) and germanium (Ge) is selected.

Thereby, the damage to the junction region 40 is reduced, and the controllability at a low doping concentration is improved. The distortion of the source region 50 can be reduced by appropriately selecting the size of the atomic weight. It is noted that, example 1 describes the case in which two types of N-type dopant are used, but three or more types of N-type dopant may be used. Likewise, three or more types of N-type dopant may be used in other examples.

Herein, the doping concentration NM of the junction region 40 in example 1 meets the following condition: $5 \times 10^{15}$ cm$^{-3}$ ≤ $N_{JFET}$ ≤ $2 \times 10^{18}$ cm$^{-3}$. It is noted that the range of doping concentration $N_{JFET}$ is one example, and is not limited thereto. The dopant of the junction region 40 may be oxygen (O). The width $W_{JFET}$ of the junction region 40 may meet the following condition: 0.5 μm ≤ $W_{JFET}$ ≤ 3 μm. Also, the doping concentration $N_{JFET}$ may meet the following condition: $5 \times 10^{15}$ cm$^{-3}$ ≤ $N_{JFET}$ ≤ $2 \times 10^{18}$ cm$^{-3}$.

Figure 1B:
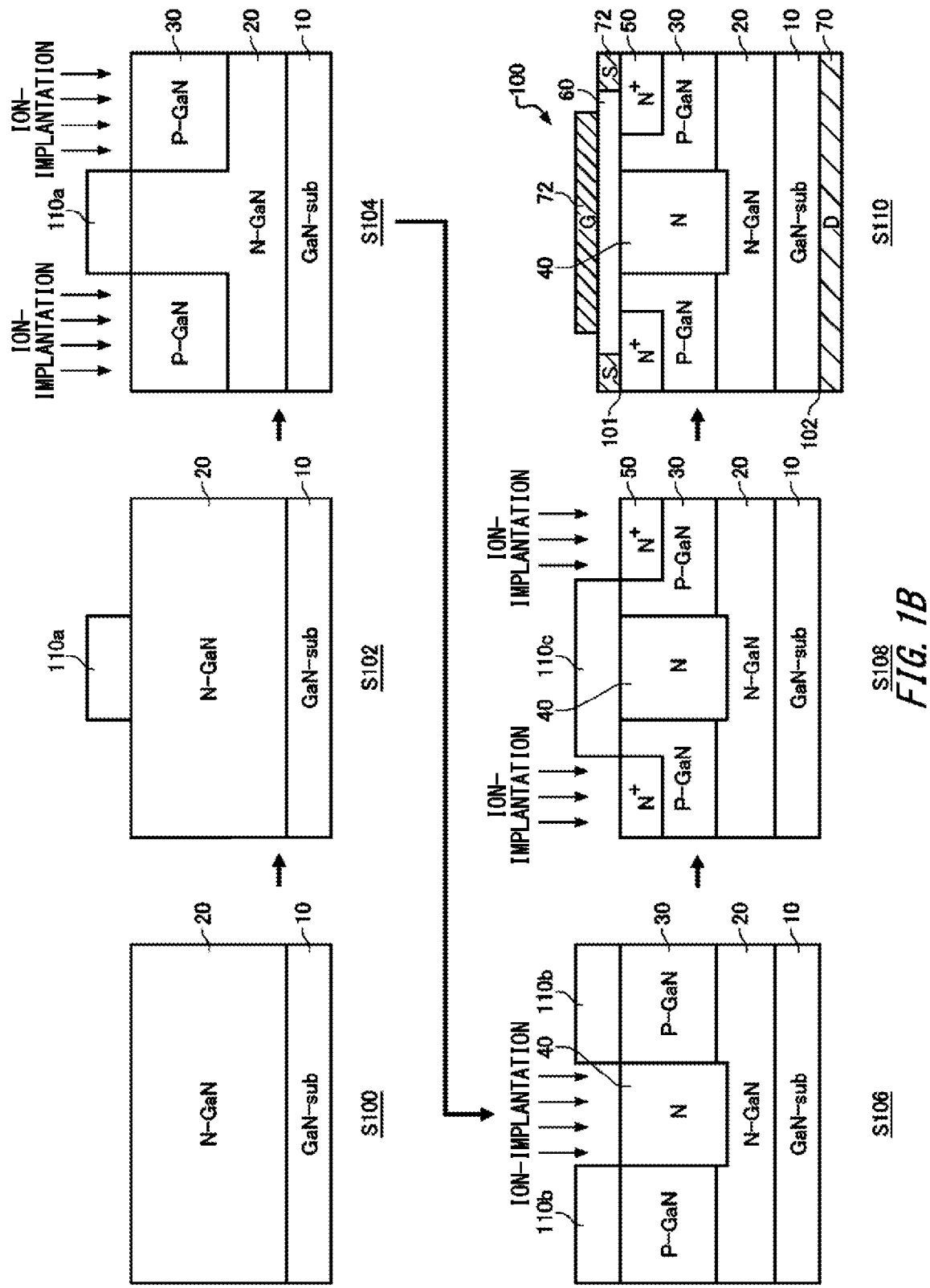
FIG. 1B shows one example of a method for fabricating the nitride semiconductor device 100 according to example 1.

FIG. 1B shows one example of the method for fabricating the nitride semiconductor device 100 according to example 1. The method for fabricating the nitride semiconductor device 100 shown in the present example is one example and is not limited thereto.

The epitaxial layer 20 is formed on the first nitride semiconductor layer 10 (S100). The epitaxial layer 20 in the present example is an N-type GaN layer epitaxially deposited on the first nitride semiconductor layer 10 by using any method such as the MOCVD method. In one example, the doping concentration of the epitaxial layer 20 is $1.0 \times 10^{15}$ cm$^{-3}$ or more and $1.0 \times 10^{17}$ cm$^{-3}$ or less. However, the doping concentration of the epitaxial layer 20 is not limited to the present example.

A mask 110a is formed on the epitaxial layer 20 (S102). The mask 110a restricts ion-implantation into the epitaxial layer 20. The mask 110a has a pattern corresponding to a region where the second nitride semiconductor layer 30 is formed. By using the mask 110a, a P-type dopant is selectively ion-implanted into a region where the second nitride semiconductor layer 30 is provided (S104).

In one example, providing the second nitride semiconductor layer 30 includes ion-implanting any one of magnesium (Mg), zinc (Zn), cadmium (Cd), beryllium (Be), and the like. The second nitride semiconductor layer 30 in the present example is formed by ion-implanting magnesium (Mg).

Ion-implanting dopants may include ion-implanting with multiple stages. Ion-implanting with multiple stages can facilitate adjustment of the doping concentration of the second nitride semiconductor layer 30 for each depth. In this specification, the term "multiple stages" means ion-implanting dopants with various implanting conditions such as accelerating voltage.

The mask 110a is then removed, and a mask 110b to form the N-type junction region 40 is formed on the epitaxial layer 20 (S106). Then, by using the mask 110b, a dopant is selectively ion-implanted into a region where the N-type junction region 40 is provided. A selective ion-implantation on the second nitride semiconductor layer 30 and the junction region 40 prevents a P-type dopant to form the second nitride semiconductor layer 30 from being ion-implanted into the junction region 40.

After the ion-implantation on the junction region 40, the nitride semiconductor device 100 may be annealed at a predetermined first temperature. Thereby, the dopants ion-implanted into the junction region 40 are activated. The first temperature may be 1200° C. or more, 1300° C. or more, 1400° C. or more, and 1500° C. or more.

Then, the mask 110b is removed, and a mask 110c to form the source region 50 is formed on the epitaxial layer 20 (S108). Then, by using the mask 110c, dopants are selectively ion-implanted into a region where an N$^+$ type source region 50 is provided. The source region 50 in the present example is formed by ion-implanting any one of silicon (Si) and germanium (Ge).

After the ion-implantation on the source region 50, the nitride semiconductor device 100 may be annealed at a predetermined second temperature. Thereby, the dopants ion-implanted into the source region 50 are activated. The second temperature may be 1200° C. or more, 1300° C. or more, 1400° C. or more, and 1500° C. or more. The second temperature may be different from the first temperature.

The insulating layer 60 and the electrode 72 are formed above the front surface 101 (S110). For example, the insulating layer 60 is silicon oxide film (SiO$_2$) whose film thickness is 400 nm. The electrode 72 may be stacked film of nickel (Ni) and gold (Au), and the film thickness may be 50 nm and 150 nm, respectively. The insulating layer 60 and the electrode 72 are patterned with a pattern according to the structure of the nitride semiconductor device 100. Then, the electrode 70 is formed on the back surface 102 of the first nitride semiconductor layer 10.

For the nitride semiconductor device 100 in the present example, ion-implanting steps on three regions, that is, the second nitride semiconductor layer 30, the junction region 40, and the source region 50, are included. After ion-implanting steps on the three regions, an annealing step which corresponds to each ion-implanting step may be included.

Specifically, after ion-implanting magnesium (Mg) for the second nitride semiconductor layer 30, and before ion-implanting oxygen (O) or silicon (Si) for the junction region 40, an annealing step may be included. After ion-implanting oxygen (O) or silicon (Si) for the junction region 40, and before ion-implanting silicon (Si) or germanium (Ge) for the source region 50, an annealing step may be included. Moreover, after ion-implanting silicon (Si) or germanium (Ge) for the source region 50, an annealing step may be included.

In addition, the order of ion-implanting steps to form the second nitride semiconductor layer 30, the junction region 40, and the source region 50 is not limited to the present example. Furthermore, the annealing steps may be performed together after a plurality of ion-implanting steps. By annealing together, the fabrication time of the nitride semiconductor device 100 can be reduced.

In one example, after the ion-implanting step on the junction region 40, an annealing step at the first temperature is included. After the ion-implanting step on the source region 50, an annealing step at a second temperature different from the first temperature of the junction region 40 may be included. For example, the first temperature is higher than the second temperature.

It is noted that, when the second temperature is higher than the first temperature, the source region 50 may be formed before the junction region 40 is formed. By performing a process at a high annealing temperature (for example, second temperature) before performing a process at a low annealing temperature (for example, first temperature), a thermal history at the second temperature higher than the first temperature is not remained in the junction region 40. For example, by annealing at a second temperature after forming the source region 50 with the ion-implantation of silicon (Si), and then forming the junction region 40 with the ion-implantation of oxygen (O) and annealing at a first temperature lower than the second temperature, the anneal can be performed without exposing the junction region 40 after the implantation of oxygen (O) to a high temperature.

Figure 2:
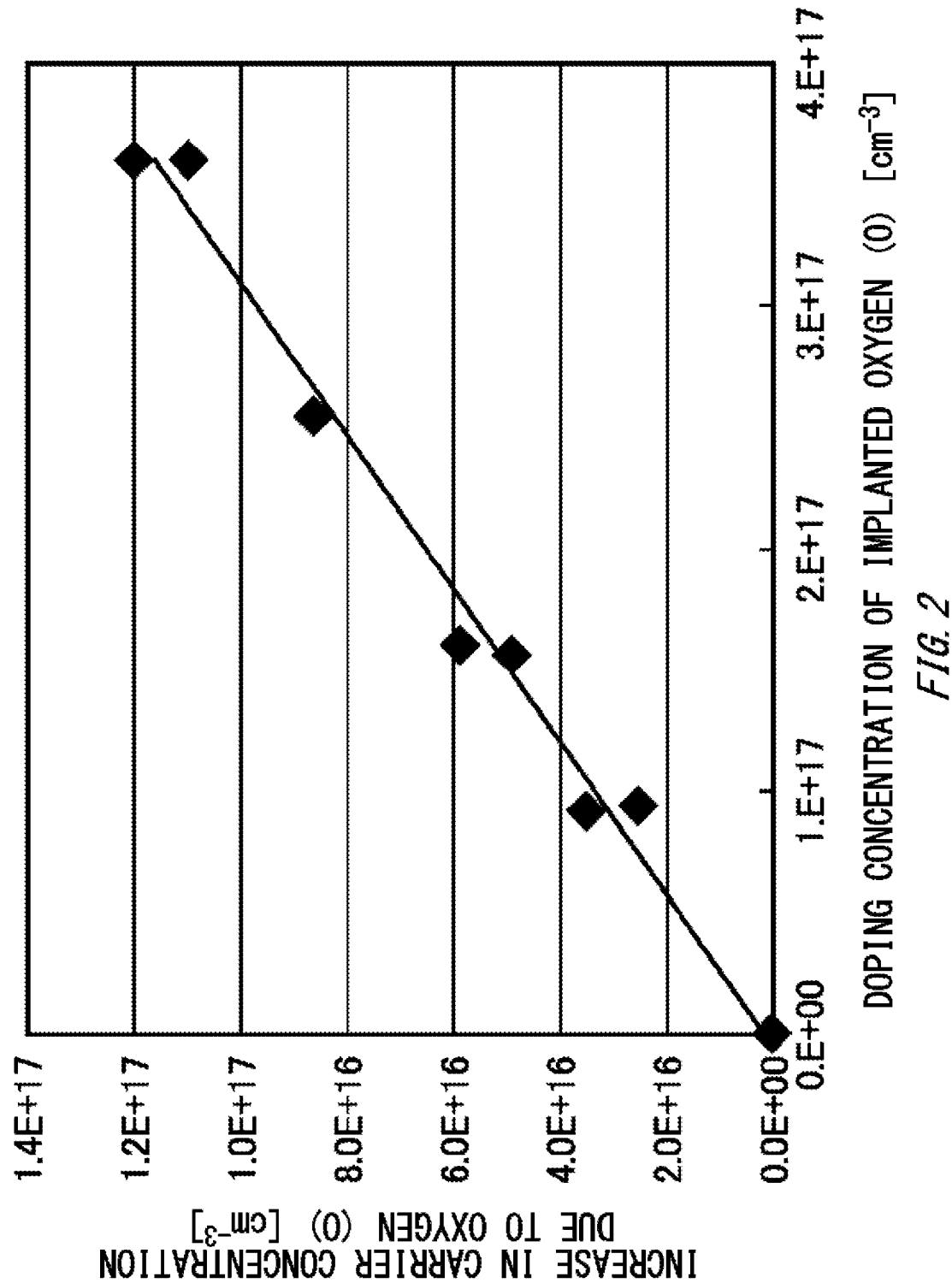
FIG. 2 shows one example of the concentration of oxygen (O) implanted in a junction region 40 according to example 1 and the increase in a carrier concentration $N_d$ due to the oxygen (O).

FIG. 2 shows one example of the doping concentration of oxygen (O) implanted into the junction region 40 according to example 1 and the increase in the carrier concentration N$_d$ due to oxygen (O) of the junction region 40. As the doping concentration of implanted oxygen (O) increases, the carrier concentration N$_d$ increases.

In the present example, the nitride semiconductor device 100 is fabricated through an annealing step at 1300° C. which is the first temperature after the junction region 40 and the source region 50 are formed, but is not limited thereto. It is noted that the range of doping concentration of oxygen (O) can be adapted to the width W$_{JFET}$ of the junction region 40 according to the correlation between N$_{JFET}$ and the concentration of oxygen (O) at 1300° C.

Figure 3A:
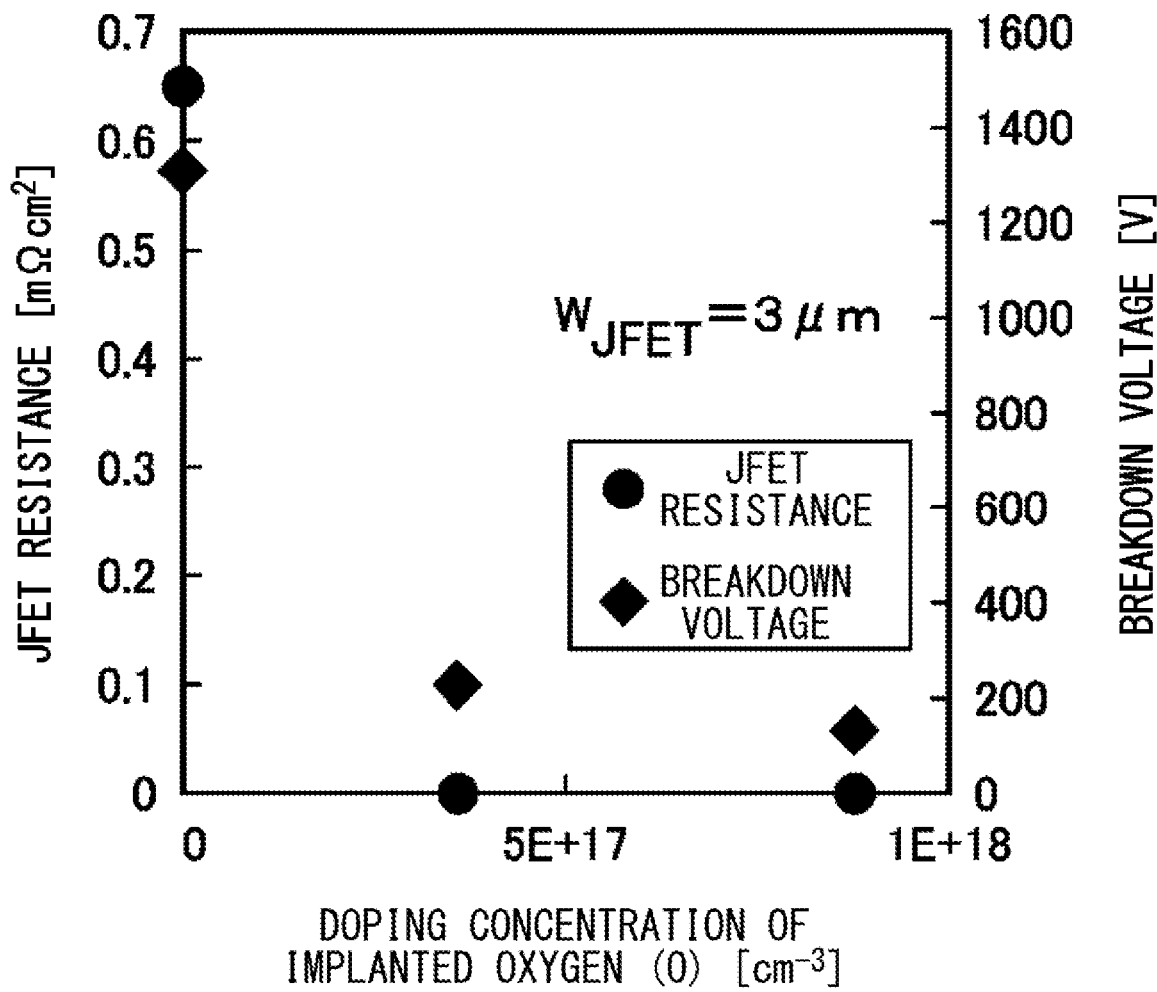
FIG. 3A shows one example of the concentration of the implanted oxygen (O), a JFET resistance being the resistance of the junction region 40, and the breakdown voltage, in a case where the width $W_{JFET}$ of the junction region 40 according to example 1 is 3 μm.
Figure 3B:
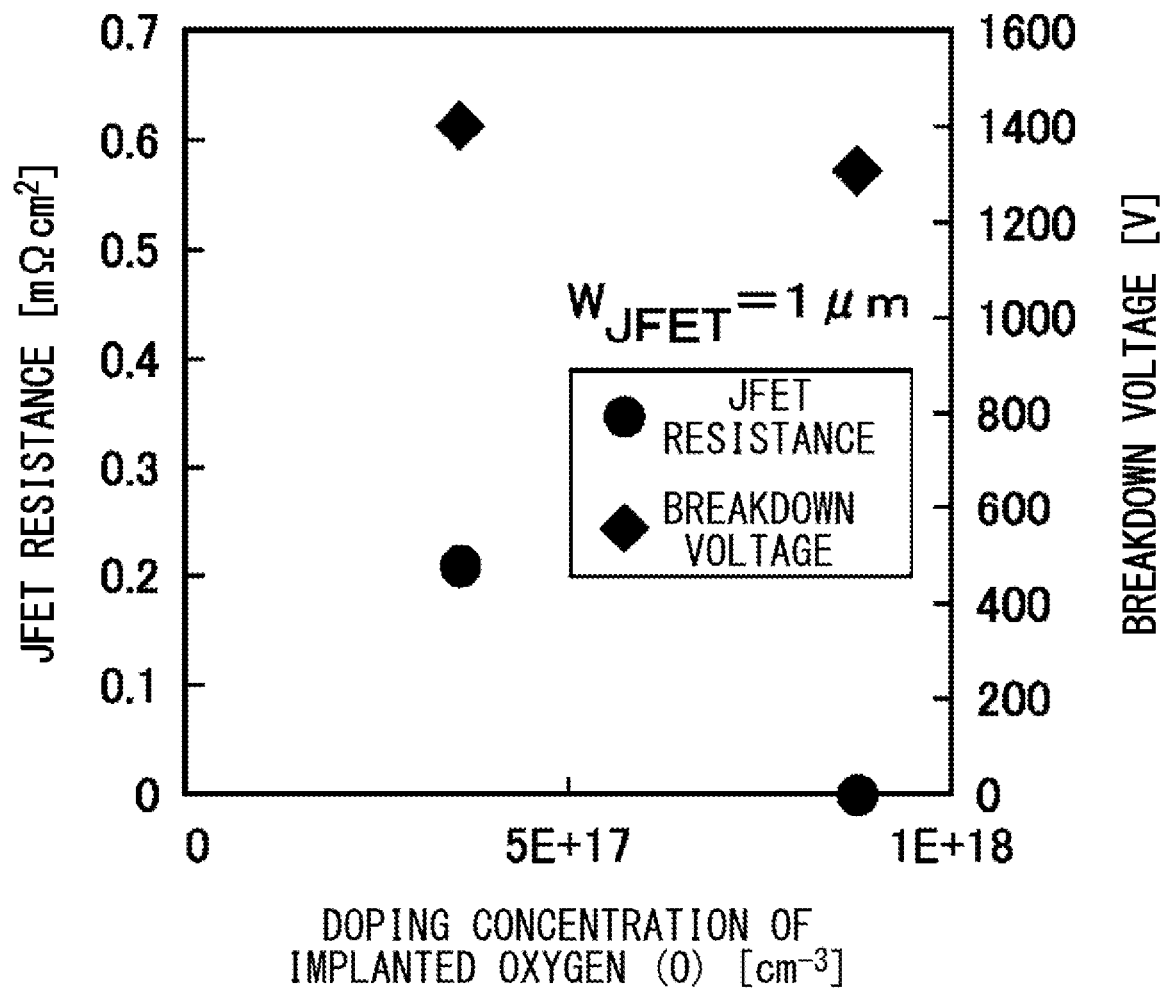
FIG. 3B shows one example of the concentration of the implanted oxygen (O), the JFET resistance of the junction region 40, and the breakdown voltage, in a case where the width $W_{JFET}$ of the junction region 40 according to example 1 is 1 μm.

FIG. 3A and FIG. 3B show the relationship between the JFET resistance being the resistance of the junction region 40, the breakdown voltage of the junction region 40, and the doping concentration of the implanted oxygen (O). FIG. 3A shows a result in a case where the width W$_{JFET}$ of the junction region 40 according to example 1 is 3 μm. FIG. 3B shows a result in a case where the width W$_{JFET}$ of the junction region 40 according to example 1 is 1 μm.

The present example shows the tendency that the JFET resistance and the breakdown voltage decrease as the doping concentration of oxygen (O) increases. It is noted that, in the present example, the JFET resistance and the breakdown voltage in a case where the doping concentration of oxygen (O) is 0 cm$^{-3}$, 3.6×10$^{17}$ cm$^{-3}$, and 9.0×10$^{17}$ cm$^{-3}$ are each plotted.

In the junction region 40, the JFET resistance of the junction region 40 is 0.4 mΩcm$^2$ or less when the element breakdown voltage is 1200 V. It is noted that this numerical value is one example and is not limited to the present embodiment.

In reference to FIG. 3A, the JFET resistance is approximately 0 mΩcm² when the doping concentration of oxygen (O) is $3.6 \times 10^{17}$ cm⁻³. On the other hand, the breakdown voltage decreases to 1200 V or less. This result suggests that, in the present embodiment, the upper limit of the doping concentration of oxygen (O) is $3.6 \times 10^{17}$ cm⁻³ when the width $W_{JFET}$ is 3 µm.

The JFET resistance when no oxygen (O) is doped, that is, the original JFET resistance is approximately 0.65 mΩcm². In addition, the original breakdown voltage is approximately 1350 V. From this, it can be seen that, when each of the plots of the JFET resistance and the breakdown voltage in FIG. 3A is connected with a curved line, the lower limit of the doping concentration of oxygen (O) at which the JFET resistance is 0.4 mΩcm² or less and the breakdown voltage is 1200 V or more is approximately $5.0 \times 15$ cm⁻³.

In reference to FIG. 3B, the case in which the doping concentration of oxygen (O) is 0 is not shown. This is because, when the width $W_{JFET}$ is 1 µm, the original JFET resistance is 100 mΩcm² or more, and the nitride semiconductor device 100 in the present embodiment cannot operate.

In a case where the doping concentration of oxygen (O) is $3.6 \times 10^{17}$ cm⁻³, the JET resistance is approximately 0.2 mΩcm² and the breakdown voltage is approximately 1400 V. In addition, in a case where the doping concentration of oxygen (O) is $9.0 \times 10^{17}$ cm⁻³, the JET resistance is approximately 0 mΩcm² and the breakdown voltage is approximately 1300 V. Because the JFET resistance is preferably close to 0 mΩcm², in the present embodiment, it can be seen that when the width $W_{JFET}$ is 1 µm, the upper limit of the doping concentration of oxygen (O) is $9.0 \times 10^{17}$ cm⁻³.

In addition, when the plots of JFET resistance in FIG. 3B are connected with a curved line, it can be seen that the WET resistance is 0.4 mΩcm² or less when the doping concentration of oxygen (O) is $1.0 \times 10^{17}$ cm⁻³ or more. Therefore, it can be seen that the lower limit of the doping concentration of oxygen (O) is $1.0 \times 10^{17}$ cm⁻³.

Figure 4:
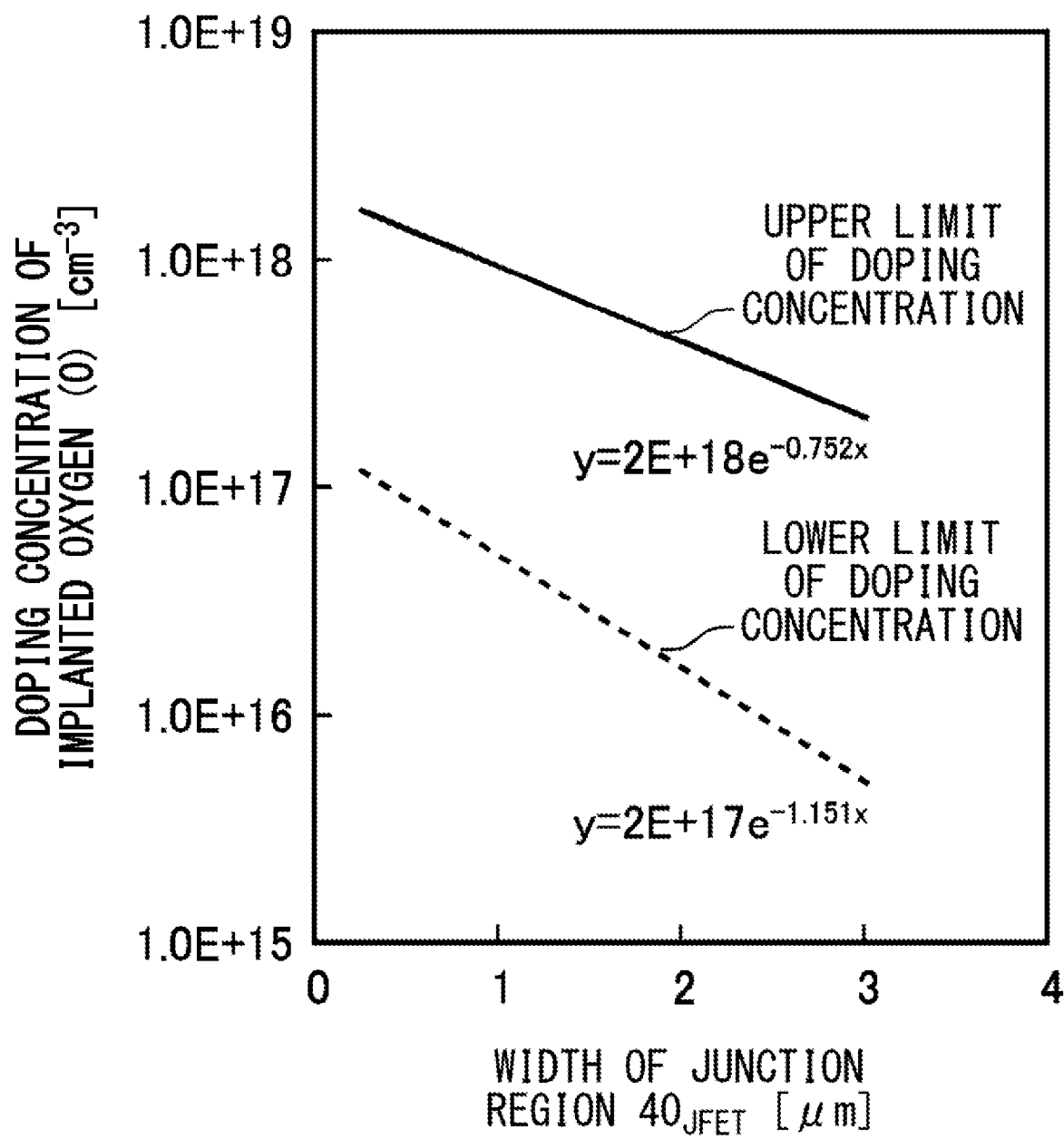
FIG. 4 shows one example of the relationship between the width $W_{JFET}$ of the junction region 40 according to example 1 and the concentration of the implanted oxygen (O).

FIG. 4 shows one example in which the relationship between the width $W_{JFET}$ and the doping concentration of the implanted oxygen (O) is calculated from the result in FIG. 3A and FIG. 3B. In FIG. 4, the upper limit and the lower limit of the doping concentration of oxygen (O) are indicated with a solid line and a dashed line, respectively. FIG. 4 shows the relationship according to example 1, and it is not limited to the present embodiment.

The doping concentration range (cm⁻³) of oxygen (O) and the width $W_{JFET}$ (µm) meets the following Equation 1.

$$2 \times 10^{17} \times \exp(-1.15 \times W_{JFET}) \leq N_{JFET} \leq 2 \times 10^{18} \times \exp(-0.75 \times W_{JFET}) \quad \text{[Equation 1]}$$

Herein, the unit of width $W_{JFET}$ is µm. For example, when the width $W_{JFET}$ is 1 µm, the upper limit value and the lower limit value of the doping concentration $N_{JFET}$ of oxygen (O) (cm⁻³) can be derived by substituting 1 in Equation 1.

In addition, based on the calculation result of Equation 1, the dose range of dose $Dose_{JFET}$ of oxygen (O)(cm⁻²) and the width $W_{JFET}$ (µm) meet the following Equation 2.

$$1.3 \times 10^{13} \times \exp(-1.15 \times W_{JFET}) \leq Dose_{JFET} \leq 1.3 \times 10^{14} \times \exp(-0.75 \times W_{JFET}) \quad \text{[Equation 2]}$$

Herein, the unit of width $W_{JFET}$ is µm as with Equation 1. For example, when the width $W_{JFET}$ is 1 µm, the upper limit value and the lower limit value of the dose $Dose_{JFET}$ of oxygen (O) (cm⁻²) can be derived by substituting 1 in Equation 2.

Based on Equation 1 and Equation 2, the appropriate range of the doping concentration in the counter doping of oxygen (O) for the junction region 40 may be specified. Thereby, the ultra-high energy ion implantation apparatus of 1 MeV or more can be unnecessary for the fabrication of the nitride semiconductor device 100. Therefore, the fabrication cost can be reduced.

Figure 5A:
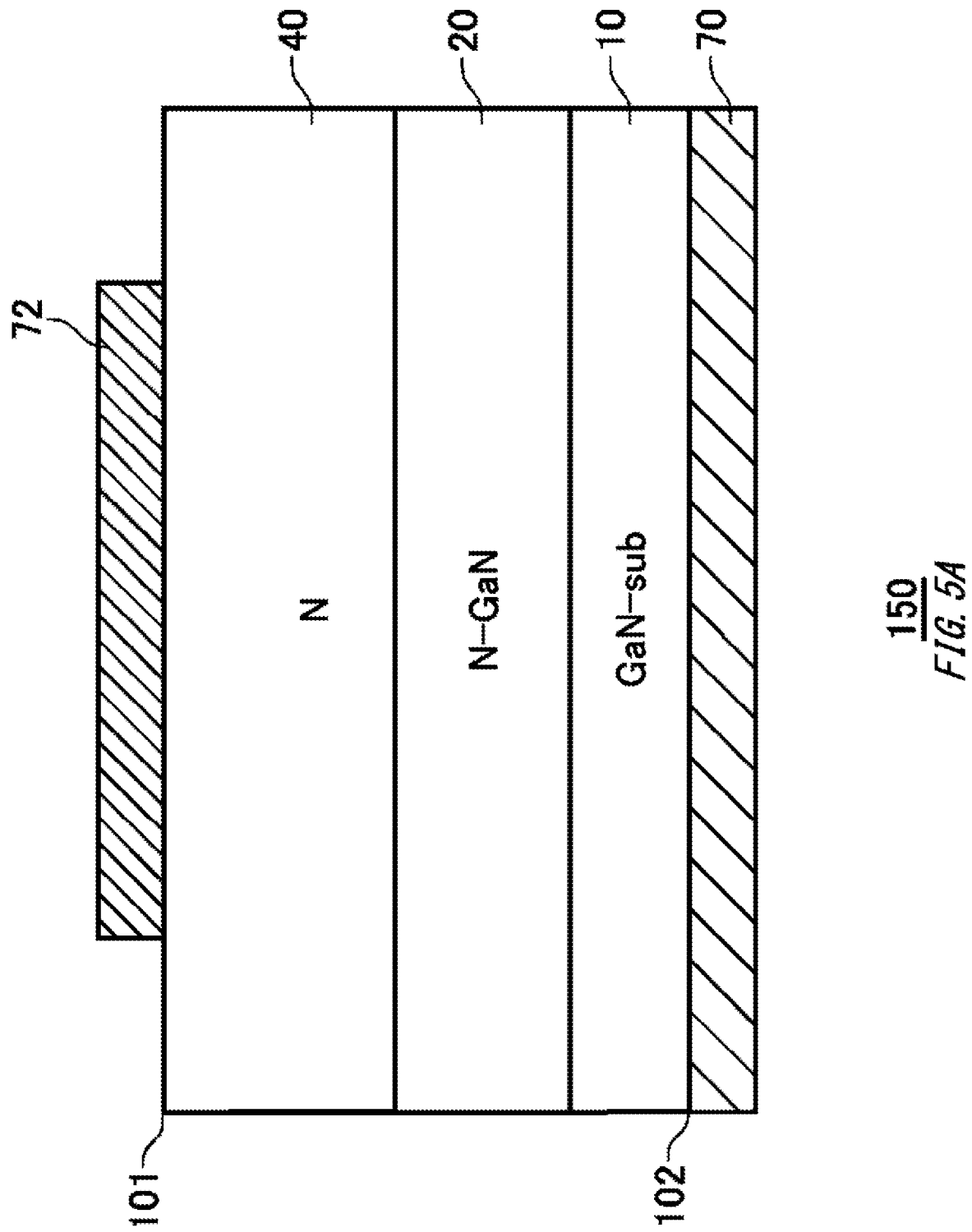
FIG. 5A shows one example of the configuration of the schottky barrier diode 150 using the junction region 40 according to example 1.

FIG. 5A shows one example of the configuration of the schottky barrier diode 150 using the junction region 40 according to example 1. The schottky barrier diode 150 is one example of the diode structure, and is not limited to the present embodiment.

The schottky barrier diode 150 includes the N-type first nitride semiconductor layer 10, the N-type epitaxial layer 20, the N-type junction region 40, the electrode 70, and the electrode 72. For the schottky barrier diode 150, the electrode 70 and 72 are formed after the oxygen (O) is implanted with the same condition as the junction region 40 of the nitride semiconductor device 100 according to example 1 and the heat process is performed at 1100° C. or 1300° C. Each of the electrodes 70 and 72 serves as the anode or cathode.

Figure 5B:
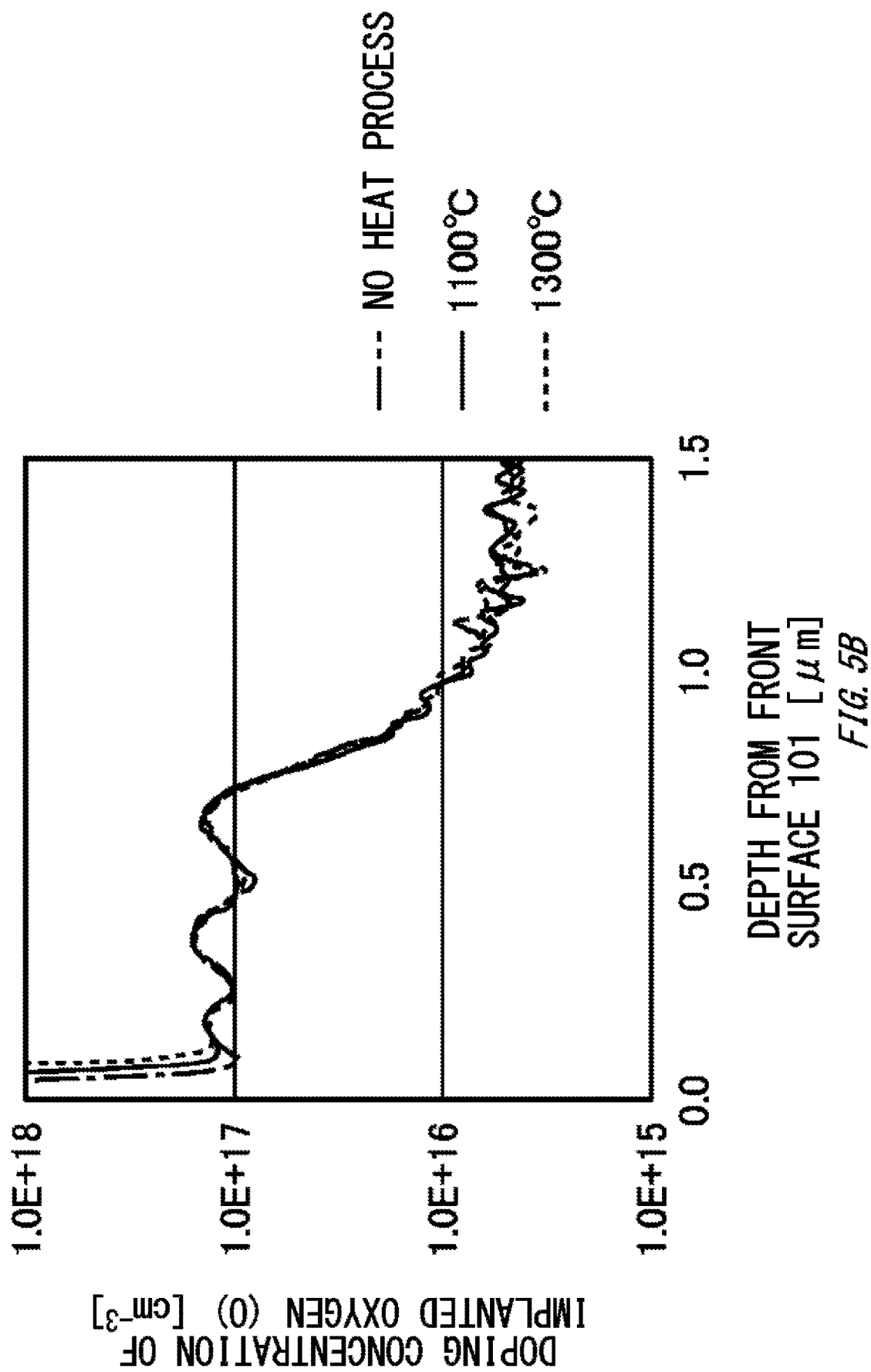
FIG. 5B shows one example of a SIMS profile in the schottky barrier diode 150 using the junction region 40 according to example 1.

FIG. 5B shows one example of a profile of SIMS (Secondary Ion Mass Spectrometry) in the schottky barrier diode 150. Thereby, the depth $D_{JFET}$ of the junction region 40 can be estimated. In one example, the depth $D_{JFET}$ is 0.7 µm.

Figure 5C:
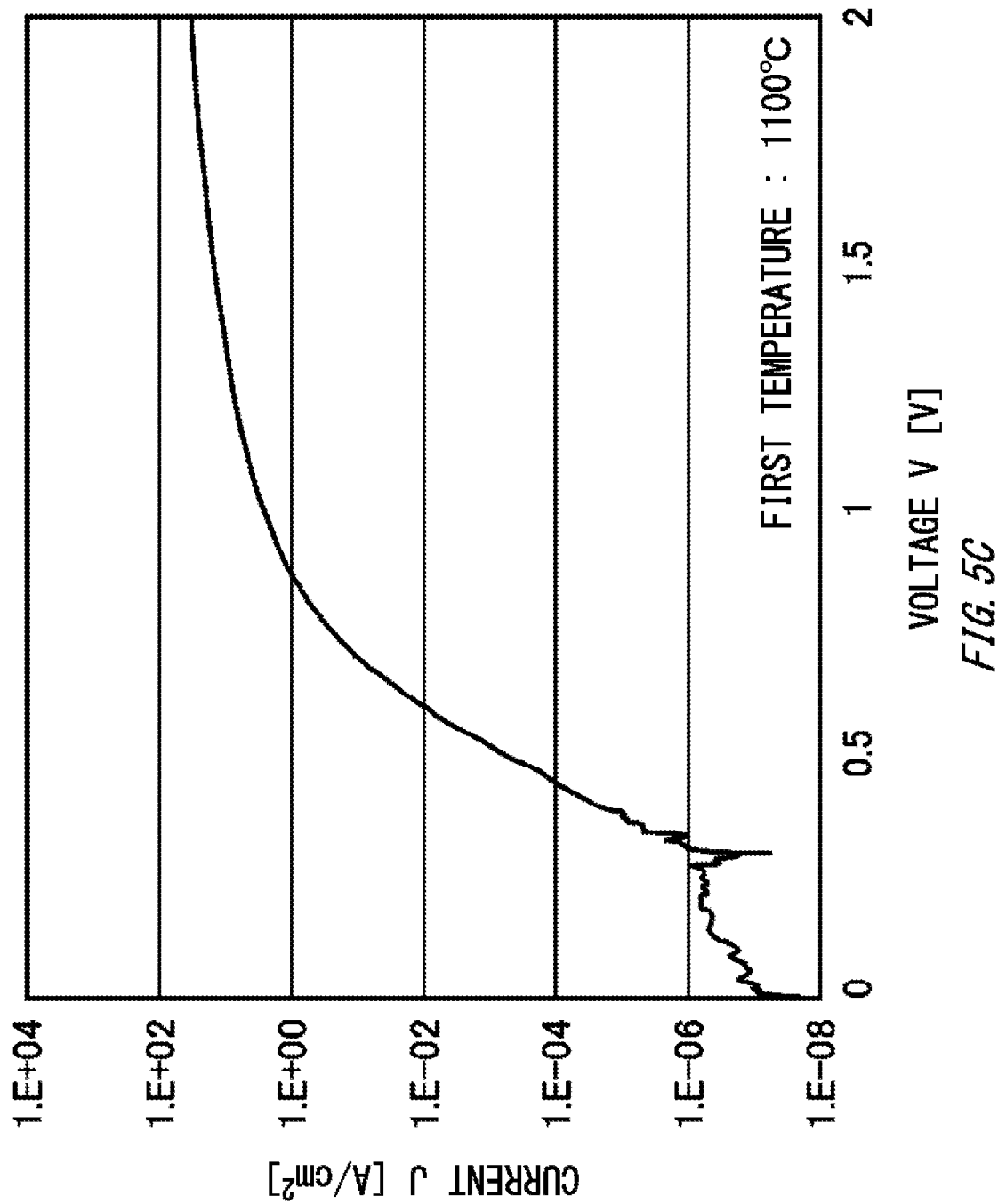
FIG. 5C shows one example of the current J-voltage V characteristics in the schottky barrier diode 150, in a case where the nitride semiconductor device 100 according to example 1 is annealed at 1100° C.

FIG. 5C shows one example of the current J-voltage V characteristics of the schottky barrier diode 150 in a case where the annealing is performed at the first temperature 1100° C. In FIG. 5C, the current reaches approximately $1.5 \times 10^{1}$, A/cm².

Figure 5D:
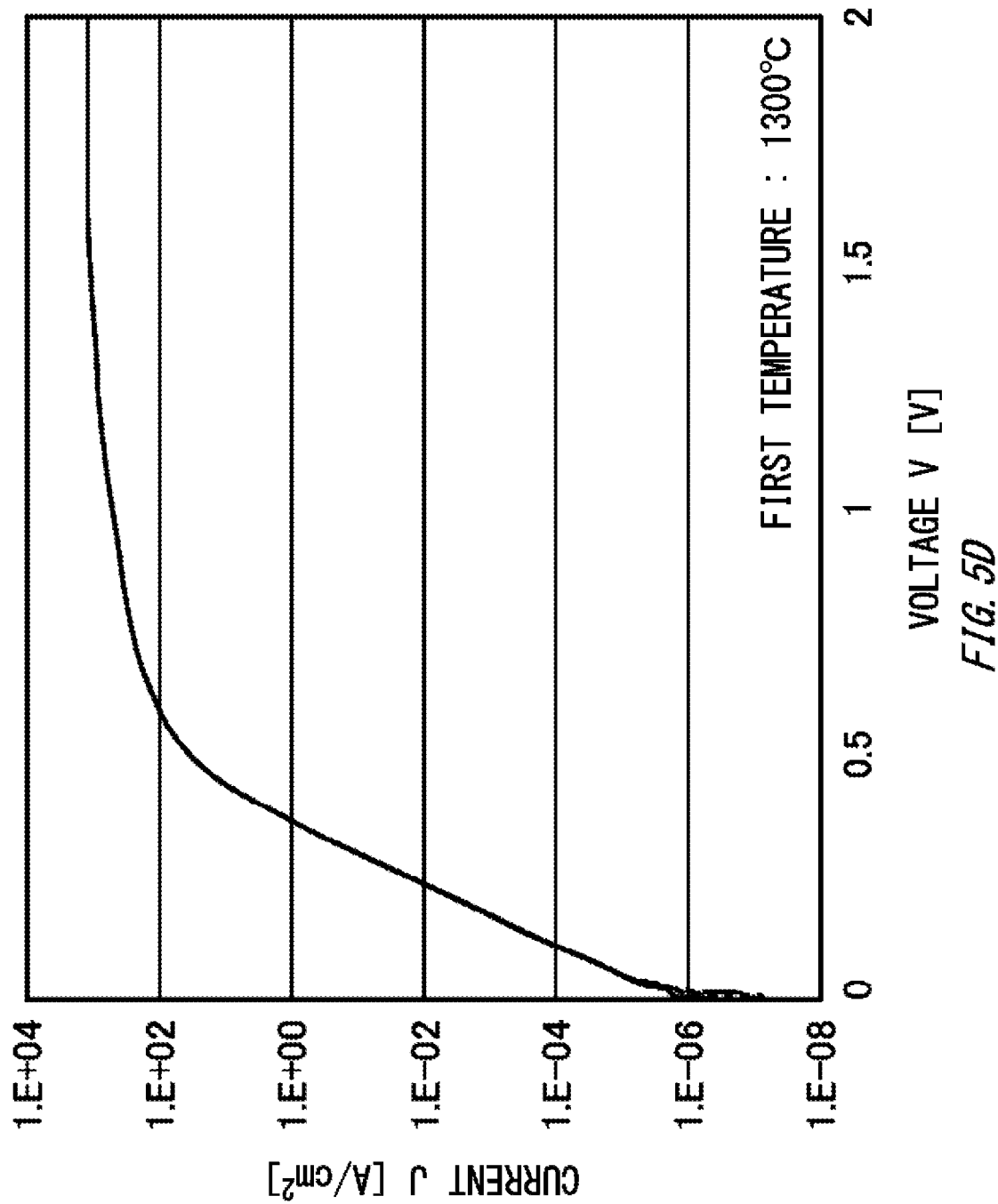
FIG. 5D shows one example of the current J-voltage V characteristics in the schottky barrier diode 150, in a case where the nitride semiconductor device 100 according to example 1 is annealed at 1300° C.

FIG. 5D shows one example of the current J-voltage V characteristics of the schottky barrier diode 150 in a case where the annealing is performed at the first temperature 1300° C. In FIG. 5D, the current reaches $1 \times 10^{3}$ A/cm² unlike in a case with 1100° C.

Therefore, in present embodiment, it can be seen that the activation ratio is improved by increasing the temperature from the first annealing temperature 1100° C., at which the maximum current value is lower by approximately two degrees of magnitude, to 1300° C. It is noted that the first annealing temperature may be 1300° C. or more, in which case the activation ratio is further increased.

FIG. 6A shows one example of the configuration of the nitride semiconductor device 100 according to example 2. The basic structure of the nitride semiconductor device 100 in the present example is the same as that of the nitride semiconductor device 100 according to example 1.

However, the nitride semiconductor device 100 in the present example is different from the nitride semiconductor device 100 according to example 1 in that it has the second nitride semiconductor layer 35 which is epitaxially deposited. The present example particularly describes the difference from the example 1.

The second nitride semiconductor layer 35 is provided on the epitaxial layer 20. The second nitride semiconductor layer 35 may be formed by using the MOCVD method as with the epitaxial layer 20. The second nitride semiconductor layer 35 may be provided continuously after the epitaxial layer 20 is epitaxially deposited. In this case, the second nitride semiconductor layer 35 is continuously deposited by the influx of dopant gas different from that during the deposition of the epitaxial layer 20. The nitride semiconductor device 100 in example 2 does not include a step of P-type ion-implantation. This possibly reduces the crystal defect of the GaN layer, which is caused by ion-implantation and degrades the electrical characteristics of the nitride semiconductor device 100.

In the present example, the doping concentration $N_{JFET}$ in the junction region 40 meets the following condition in which the dopant concentration $N_{Epi}$ of the second nitride semiconductor layer 35 is used: $N_{Epi}+5\times10^{15}$ cm$^{-3}$ ≤ $N_{JFET}$ ≤ $N_{Epi}+2\times10^{18}$ cm$^{-3}$. Thereby, the JFET resistance and breakdown voltage of the nitride semiconductor device 100 can become appropriate values. It is noted that the range of doping concentration $N_{JFET}$ in the present example is one example, and is not limited thereto.

Figure 6B:
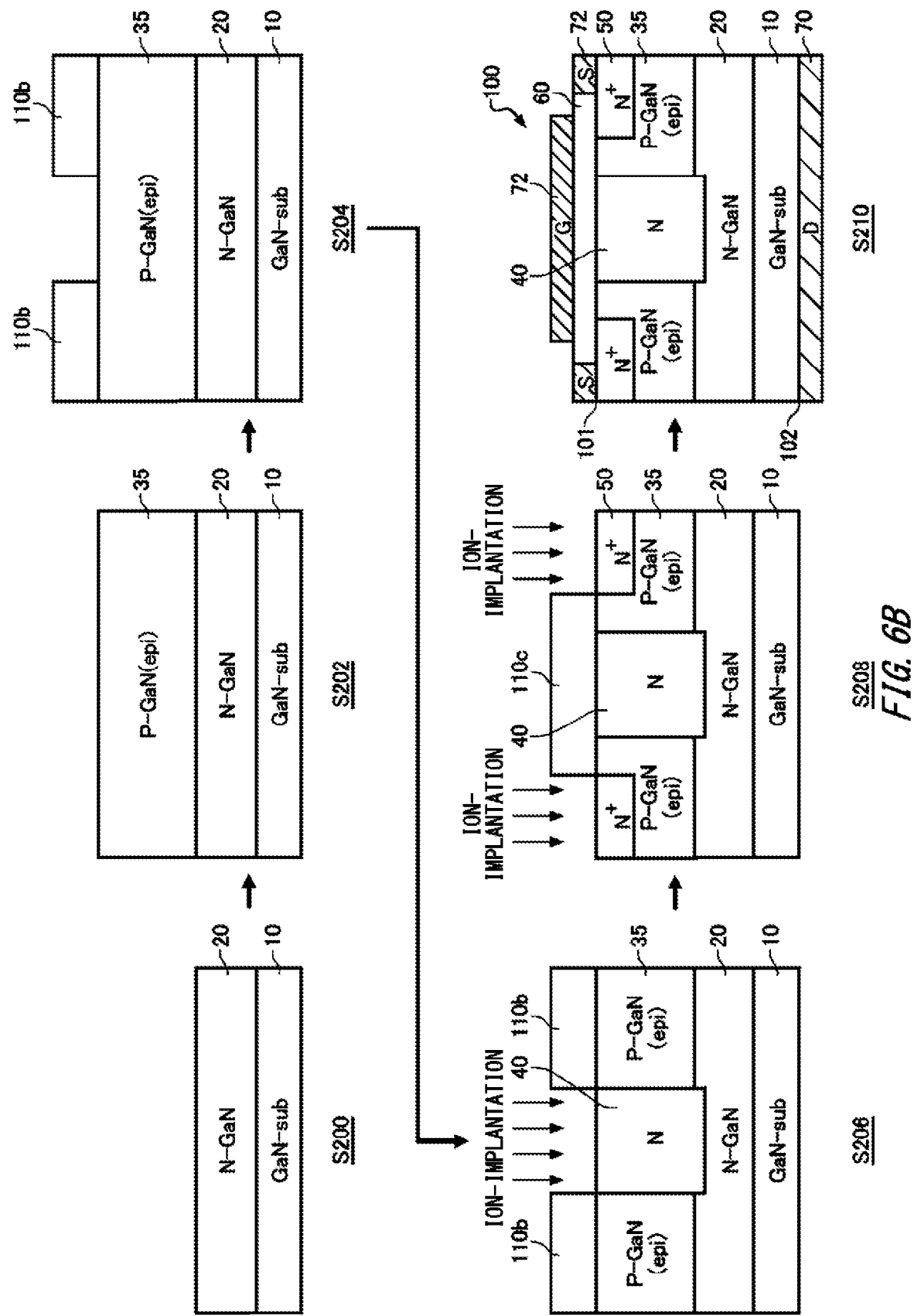
FIG. 6B shows one example of the method for fabricating the nitride semiconductor device 100 according to example 2.

FIG. 6B shows one example of the method for fabricating the nitride semiconductor device 100 according to example 2. The method for fabricating the nitride semiconductor device 100 shown in the present example is one example and is not limited thereto.

The epitaxial layer 20 is formed on the first nitride semiconductor layer 10 (S200). The epitaxial layer 20 in the present example is an N-type GaN layer epitaxially deposited on the first nitride semiconductor layer 10 by using any method such as the MOCVD method. In one example, the dopant concentration of the epitaxial layer 20 is $1.0\times10^{15}$ cm$^{-3}$ or more and $1.0\times10^{17}$ cm$^{-3}$ or less. However, the dopant concentration of the epitaxial layer 20 is not limited to the present example.

On the epitaxial layer 20, a second nitride semiconductor layer 35 is epitaxially deposited (S202). Then, on the second nitride semiconductor layer 35, the mask 110b is formed (S204). The mask 110b restricts the ion-implantation on the second nitride semiconductor layer 35. The mask 110b has a pattern corresponding to the region where the junction region 40 is formed.

N-type dopants are selectively ion-implanted into a region provided in the junction region 40 by using the mask 110b (S206). Because the second nitride semiconductor layer 35 is epitaxially deposited, the junction region 40 includes magnesium (Mg) to make the P-type second nitride semiconductor layer 35.

In one example, providing the junction region 40 includes ion-implanting at least one of oxygen (O) and silicon (Si). The junction region 40 in the present example is formed by ion-implanting oxygen (O).

Ion-implanting dopants may include ion-implanting with multiple stages. Ion-implanting with multiple stages can facilitate adjustment of the doping concentration of the second nitride semiconductor layer 35 for each depth.

Then, the mask 110b is removed, and a mask 110c to form the source region 50 is formed on the second nitride semiconductor layer 35 (S208). Then, by using the mask 110c, N-type dopants are selectively ion-implanted into a region where the source region 50 is provided. The source region 50 in the present example is formed by ion-implanting any one of silicon (Si) and germanium (Ge).

Then, the mask 110c is removed, and the insulating layer 60 and the electrode 72 are formed above the second nitride semiconductor layer 35 (S210). For example, the insulating layer 60 is silicon oxide film (SiO$_2$) whose film thickness is 400 nm. The electrode 72 may be stacked film of nickel (Ni) and gold (Au), and the film thickness may be 50 nm and 150 nm, respectively. The insulating layer 60 and the electrode 72 are patterned with a pattern according to the structure of the nitride semiconductor device 100. Then, the electrode 70 is formed on the back surface 102 of the first nitride semiconductor layer 10.

FIG. 7A shows one example of the configuration of the nitride semiconductor device 100 according to example 3. The nitride semiconductor device 100 in the present example is one example of a trench MOSFET. The present example is different from the nitride semiconductor device 100 according to example 2 in that the nitride semiconductor device 100 includes the trench portion 80. In the present example, the difference from example 2 is particularly described.

The trench portion 80 is provided on the upper surface of the epitaxial layer 20. The trench portion 80 is provided such that it extends from the upper surface of the second nitride semiconductor layer 35 to the inside. The depth and width of the trench portion 80 are not particularly limited. It is noted that the nitride semiconductor device 100 in the present example has the second nitride semiconductor layer 35 on the epitaxial layer 20. However, the second nitride semiconductor layer 30 may be provided instead of the second nitride semiconductor layer 35 as with example 2.

The junction region 45 is provided on the lower surface of the trench portion 80. The junction region 45 is formed by ion-implanting N-type dopants into the bottom surface of the trench portion 80. In one example, the dopant includes at least one of oxygen (O) and silicon (Si). For example, the depth $D_{JFET}$ of the junction region 45 is 200 nm or more and 2000 nm or less from the front surface 101. More preferably, it is 500 nm or more and 1500 nm or less.

The source region 55 is provided on the side of the front surface 101 of the second nitride semiconductor layer 35. The source region 55 is provided more shallowly than the junction region 45. In one example, the depth of the source region 55 is 10 nm or more and 100 nm or less.

Figure 7B:
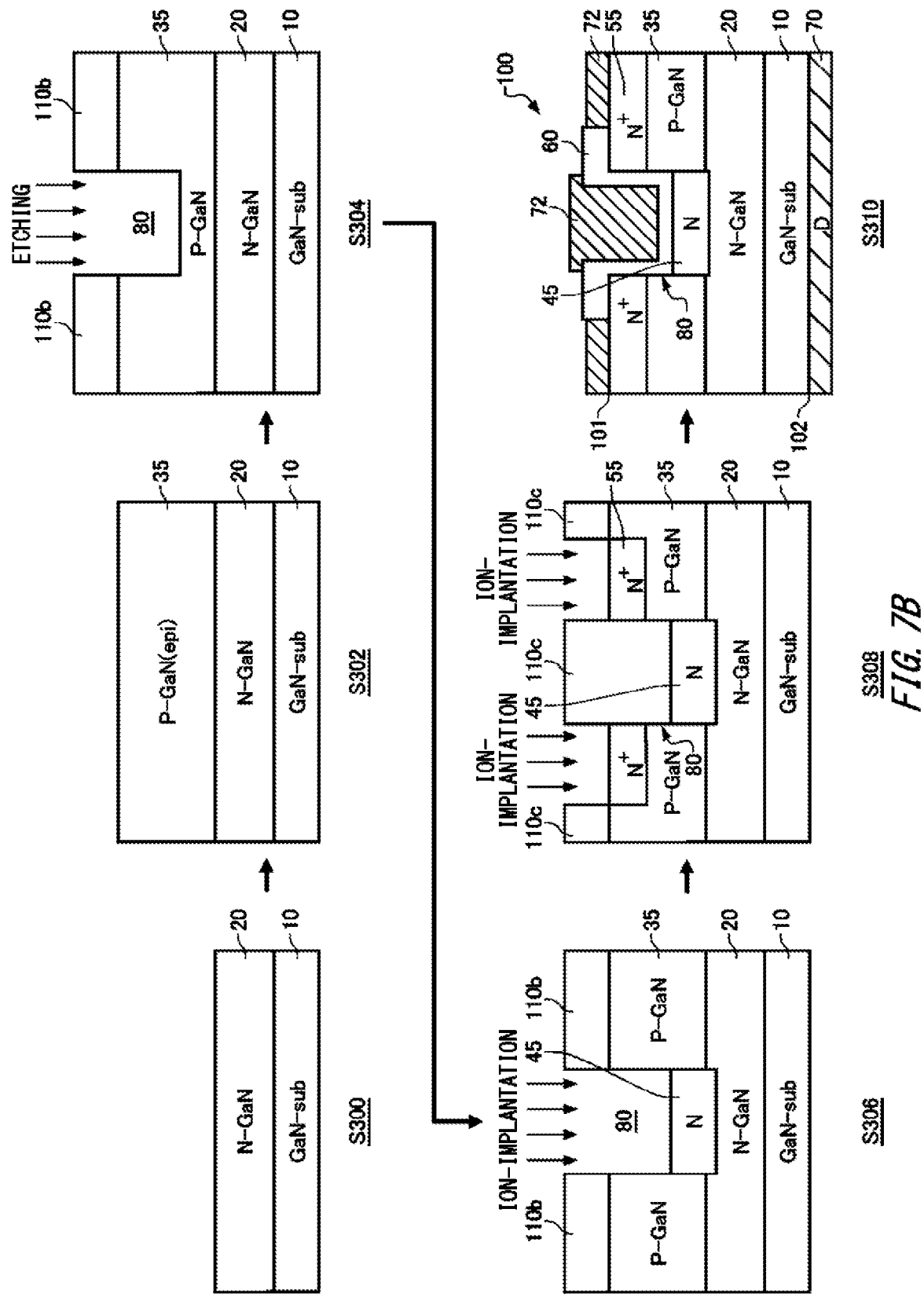
FIG. 7B shows one example of the method for fabricating the nitride semiconductor device 100 according to example 3.

FIG. 7B shows one example of the method for fabricating the nitride semiconductor device 100 according to example 3. The method for fabricating the nitride semiconductor device 100 shown in the present example is one example and is not limited thereto.

On the first nitride semiconductor layer 10, the epitaxial layer 20 is formed (S300). The epitaxial layer 20 in the present example is an N-type GaN layer epitaxially deposited on the first nitride semiconductor layer 10 by using any method such as the MOCVD method. In one example, the dopant concentration of the epitaxial layer 20 is $1.0\times10^{15}$ cm$^{-3}$ or more and $1.0\times10^{17}$ cm$^{-3}$ or less. However, the dopant concentration of the epitaxial layer 20 is not limited to the present example.

On the epitaxial layer 20, the second nitride semiconductor layer 35 is epitaxially deposited (S302). Then, on the second nitride semiconductor layer 35, the mask 110b is formed (S304). The mask 110b restricts the etching on apart of the second nitride semiconductor layer 35. In addition, the mask 110b in the present example is used to restrict the ion-implantation to provide the junction region 45. The mask 110b in the present example has a pattern corresponding to the region where the trench portion 80 is formed.

The region where the trench portion 80 is to be provided is selectively etched by using the mask 110b (S306). The second nitride semiconductor layer 35 is etched by using chlorine gas as one example. After the second nitride semiconductor layer 35 is etched, the junction region 45 is provided.

In one example, providing the junction region 45 includes ion-implanting any one of oxygen (O) and silicon (Si) (S306). The junction region 45 in the present example is formed by ion-implanting oxygen (O).

Ion-implanting dopants may include ion-implanting with multiple stages. Ion-implanting with multiple stages can facilitate adjustment of the doping concentration of the junction region 45 for each depth.

Then, the mask 110b is removed, and the mask 110c to form the source region 55 is formed (S308). Then, by using the mask 110c, N-type dopants are selectively ion-implanted into a region where the source region 55 is provided. Providing the source region 55 includes ion-implanting any one of silicon (Si) and germanium (Ge). The source region 55 in the present example is formed by ion-implanting silicon (Si).

Then, the mask 110c is removed, and the insulating layer 60 and the electrode 72 are formed (S310). For example, the insulating layer 60 is silicon oxide film ($SiO_2$) whose film thickness is 400 nm. The electrode 72 may be stacked film of nickel (Ni) and gold (Au), and the film thickness may be 50 nm and 150 nm, respectively. The insulating layer 60 and the electrode 72 are patterned with a pattern according to the structure of the nitride semiconductor device 100. Then, the electrode 70 is formed on the back surface 102 of the first nitride semiconductor layer 10.

For the nitride semiconductor device 100 in example 3, the junction region 45 is formed after the trench portion 80 is provided through etching. Thereby, the ion-implantation to form the junction region 45 can be shallower by the depth of the trench portion 80. However, for the nitride semiconductor device 100, etching to form the trench portion 80 may be performed after ion-implanting dopants to form the junction region 45.

Figure 8:
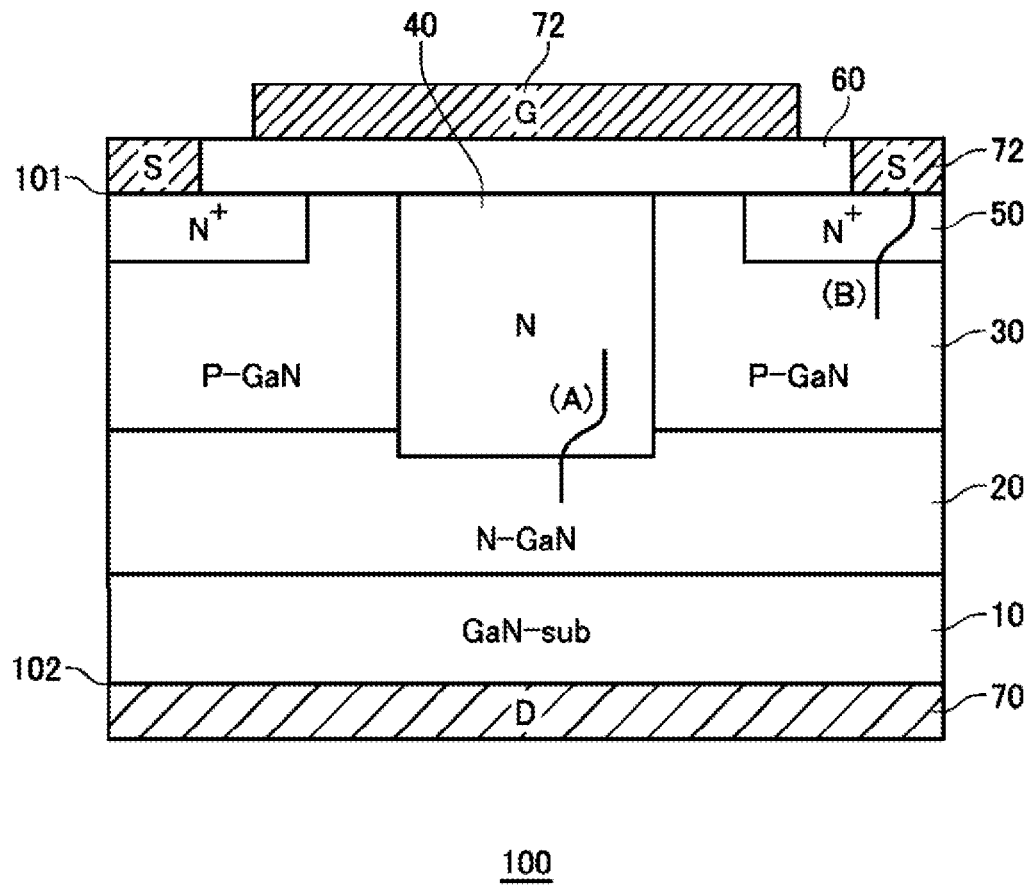
FIG. 8 shows one example of the doping concentration of the second nitride semiconductor layer 30 included in the nitride semiconductor device 100 according to example 1.
Figure 8:
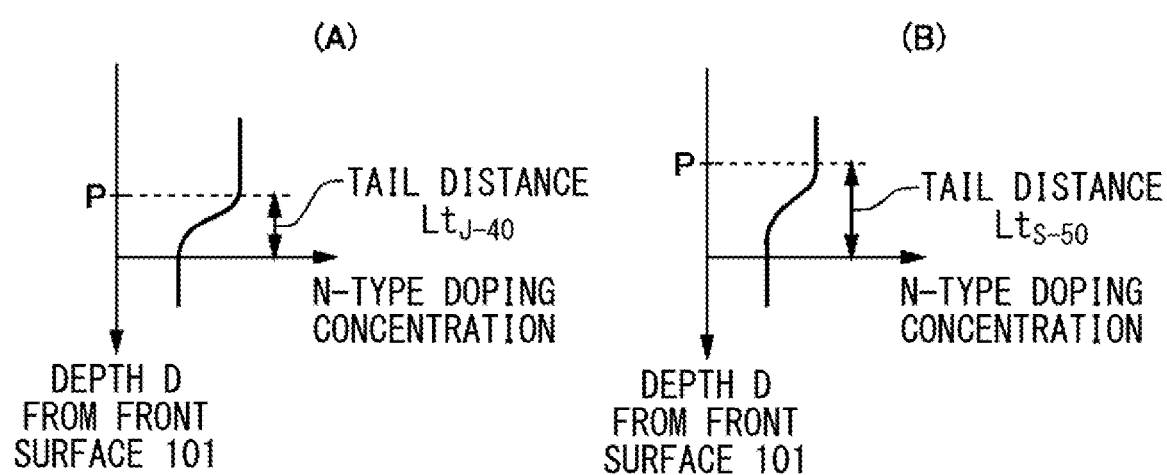

FIG. 8 shows one example of the doping concentration in the junction region 40 and the source region 50 in example 1. In addition, FIG. 8 is a diagram to describe the tail of the doping concentration in the N-type region at depth D from the front surface 101. FIG. 8 shows tail length Lt in a case where the N-type region is formed through ion-implantation in example 1.

FIG. 8(A) shows the tail length $Lt_{J-40}$ of the N-type dopant which is ion-implanted to form the junction region 40. The tail length $Lt_{J-40}$ is the tail length Lt from the peak P of the doping concentration in the junction region 40 to the lower end of the junction region 40. When the junction region 40 is formed through ion-implantation with multiple stages, the peak P of the doping concentration in the junction region 40 refers to the peak of the deepest ion-implantation.

FIG. 8(B) shows the tail length $Lt_{S-50}$ of the N-type dopant ion-implanted to form the source region 50. The tail length $Lt_{S-50}$ is the tail length Lt from the doping concentration peak of the source region 50 to the lower end of the source region 50. When the source region 50 is formed through ion-implantation with multiple stages, the peak P of the doping concentration in the source region 50 refers to the peak of the deepest ion-implantation.

The tail length $Lt_{J-40}$ in the present example is less than the tail length $Lt_{S-50}$. The tail length $Lt_{J-40}$ can be reduced to be shorter than the tail length $Lt_{S-50}$ by selecting a dopant which possibly causes the tail length $Lt_{J-40}$ to be small. For example, the tail length $Lt_{J-40}$ is reduced to be shorter than the tail length $Lt_{S-50}$ by ion-implanting oxygen (O) into the junction region 40 and ion-implanting silicon (Si) or germanium (Ge) into the source region 50.

For example, the implantation depth of the peak P in the junction region 40 is 800 nm, and the tail length $Lt_{J-40}$ is smaller than 500 nm. In this case, for example, the implantation depth of the peak P in the source region 50 is 20 nm, and the tail length $Lt_{S-50}$ is 500 nm. However, the doping concentration distribution of the junction region 40 and the source region 50 is not limited to the present example. In addition, the description about the doping concentration in the junction region 40 and the source region 50 in the present example is similarly applied to the description about the doping concentration according to all examples.

The tail length $Lt_{J-40}$ may have approximately the same size as the tail length $Lt_{S-50}$. In one example, the tail length $Lt_{J-40}$ is within a range of ±10% of the tail length $Lt_{S-50}$.

For example, the implantation depth of the peak P in the junction region 40 is 800 nm, and the tail length $Lt_{J-40}$ is 500 nm. In this case, for example, the implantation depth of the peak P in the source region 50 is 20 nm, and the tail length $Lt_{S-50}$ is 500 nm.

However, the doping concentration distribution of the junction region 40 and the source region 50 is not limited to the present example. In addition, the description about the doping concentration in the junction region 40 and the source region 50 in the present example is similarly applied to the description about the doping concentration according to all examples.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

What is claimed is:

1. A nitride semiconductor device, comprising:
   a first nitride semiconductor layer of a first conductivity-type;
   a second nitride semiconductor layer of a second conductivity-type provided above the first nitride semiconductor layer;
   a junction region of the first conductivity-type which is provided to extend in a direction from a front surface of the second nitride semiconductor layer to the first nitride semiconductor layer and has a first type dopant implanted therein at a doping concentration $N_{JFET}$ equal to or higher than a doping concentration of the first nitride semiconductor layer, the first type dopant being oxygen, a dose $Dose_{JFET}$ in the junction region meeting a condition in which a width $W_{JFET}$ (µm) of the junction region is used: $1.3 \times 10^{13} \times \exp(-1.15 \times W_{JFET})$ cm$^{-2} \leq Dose_{JFET} \leq 1.3 \times 10^{14} \times \exp(-0.75 \times W_{JFET})$ cm$^{-2}$; and
   a source region of the first conductivity-type which is provided more shallowly than the junction region and has a second type dopant implanted therein at a doping concentration equal to or higher than the doping concentration $N_{JFET}$ of the first type dopant in the junction region, wherein
   the second type dopant implanted in the source region is an element with an atomic weight larger than an atomic weight of the first type dopant implanted in the junction region.

2. The nitride semiconductor device according to claim 1, wherein
the doping concentration $N_{JFET}$ meets a following condition: $5\times10^{15}$ cm$^{-3}$≤$N_{JFET}$≤$2\times10^{18}$ cm$^{-3}$.

3. The nitride semiconductor device according to claim 1, wherein
the first conductivity-type is N-type, and
the second type dopant in the source region includes any one of silicon (Si) and germanium (Ge).

4. The nitride semiconductor device according to claim 1, wherein
a width $W_{JFET}$ of the junction region meets a following condition: 0.5 μm≤$W_{JFET}$≤3 μm.

5. The nitride semiconductor device according to claim 1, wherein
the doping concentration $N_{JFET}$ meets a following condition in which a width $W_{JFET}$ (μm) of the junction region is used: $2\times10^{17}\times\exp(-1.15\times W_{JFET})$ cm$^{-3}$≤$N_{JFET}$≤$2\times10^{18}\times\exp(-0.75\times W_{JFET})$ cm$^{-3}$.

6. The nitride semiconductor device according to claim 1, wherein the junction region includes a third type dopant, the third type dopant being different from both the first type dopant and the second type dopant.

7. The nitride semiconductor device according to claim 1, wherein a depth $D_{JFET}$ of the junction region meets a following condition in which a depth $D_{2-NSL}$ of the second nitride semiconductor layer is used: $D_{JFET}$≥$D_{2-NSL}$.

8. The nitride semiconductor device according to claim 1, wherein a depth $D_{JFET}$ of the junction region is 300 nm or more.

9. The nitride semiconductor device according to claim 1, wherein
a depth $D_{JFET}$ of the junction region meets a following condition: 500 nm≤$D_{JFET}$≤1.5 μm.

10. The nitride semiconductor device according to claim 1, wherein a depth $D_{2-NSL}$ of the second nitride semiconductor layer meets a following condition: 200 nm≤$D_{2-NSL}$≤2 μm.

11. The nitride semiconductor device according to claim 1, wherein a depth $D_{2-NSL}$ of the second nitride semiconductor layer meets a following condition: 500 nm≤$D_{2-NSL}$≤1.5 μm.

12. The nitride semiconductor device according to claim 1, wherein a dose $Dose_S$ in the source region meets a following condition: $5\times10^{14}$ cm$^{-2}$≤$Dose_S$≤$1\times10^{16}$ cm$^{-2}$.

13. The nitride semiconductor device according to claim 1, wherein
a tail length from a peak of the doping concentration of the first type dopant in the junction region to a lower end in the junction region is less than a tail length from a peak of the doping concentration of the second type dopant in the source region to a lower end in the source region.

14. The nitride semiconductor device according to claim 1, wherein
a tail length from a peak of the doping concentration of the first type dopant in the junction region to a lower end in the junction region is within a range of ±10% of a tail length from a peak of the doping concentration of the second type dopant in the source region to a lower end in the source region.

15. A nitride semiconductor device, comprising:
a first nitride semiconductor layer of a first conductivity-type;
a second nitride semiconductor layer of a second conductivity-type provided above the first nitride semiconductor layer;
a junction region of the first conductivity-type which is provided to extend from a front surface of the second nitride semiconductor layer to the first nitride semiconductor layer and has a first type dopant implanted therein at a doping concentration $N_{JFET}$ equal to or higher than a doping concentration of the first nitride semiconductor layer, the first type dopant being oxygen, a dose $Dose_{JFET}$ in the junction region meeting a condition in which a width $W_{JFET}$ (μm) of the junction region is used: $1.3\times10^{13}\times\exp(-1.15\times W_{JFET})$ cm$^{-2}$≤$Dose_{JFET}$≤$1.3\times10^{14}\times\exp(-0.75\times W_{JFET})$ cm$^{-2}$;
a source region of the first conductivity-type which is provided more shallowly than the junction region and has a second type dopant implanted therein at a doping concentration equal to or higher than the doping concentration $N_{JFET}$ of the first type dopant in the junction region, wherein
the doping concentration $N_{JFET}$ of the first type dopant meets a following condition in which a dopant concentration $N_{Epi}$ in the second nitride semiconductor layer satisfies: $N_{Epi}+5\times10^{15}$ cm$^{-3}$≤$N_{JFET}$≤$N_{Epi}+2\times10^{18}$ cm$^{-3}$, and
the second type dopant implanted in the source region is an element with an atomic weight larger than an atomic weight of the first type dopant implanted in the junction region.

16. The nitride semiconductor device according to claim 15, comprising a trench portion in the second nitride semiconductor layer, wherein the junction region is included at a bottom of the trench portion.

17. A method for fabricating a nitride semiconductor device, comprising:
providing a junction region of a first conductivity-type having a doping concentration $N_{JFET}$ by ion-implanting first type dopant ions of the first conductivity-type, the first type dopant being oxygen; and
providing a source region which is shallower than the junction region by ion-implanting second type dopant ions of an element having an atomic weight higher than an atomic weight of the first type dopant ions in the junction region,
wherein a dose $Dose_{JFET}$ in the junction region meets a condition in which a width $W_{JFET}$ (μm) of the junction region is used: $1.3\times10^{13}\times\exp(-1.15\times W_{JFET})$ cm$^{-2}$≤$Dose_{JFET}$≤$1.3\times10^{14}\times\exp(-0.75\times W_{JFET})$ cm$^{-2}$.

18. The method for fabricating a nitride semiconductor device according to claim 17, wherein
a doping concentration $N_{JFET}$ of the first type dopant ions in the junction region meets a following condition: $5\times10^{15}$ cm$^{-3}$≤$N_{JFET}$≤$2\times10^{18}$ cm$^{-3}$.

19. The method for fabricating a nitride semiconductor device according to claim 18, comprising:
providing a trench portion through etching before ion-implanting the first type dopant ions in the junction region.

20. The method for fabricating a nitride semiconductor device according to claim 18, comprising
annealing at a first temperature after ion-implantation on the junction region; and
annealing at a second temperature different from the first temperature after ion-implantation on the source region.

21. The method for fabricating a nitride semiconductor device according to claim 20, wherein the first temperature is 1300° C. or more.

* * * * *